United States Patent
Kim et al.

(10) Patent No.: US 6,555,409 B2
(45) Date of Patent: Apr. 29, 2003

(54) METHOD FOR FABRICATING A THIN FILM TRANSISTOR ARRAY SUBSTRATE FOR LIQUID CRYSTAL DISPLAY

(75) Inventors: Sang-Gab Kim, Seoul (KR); Mun-Pyo Hong, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/892,576

(22) Filed: Jun. 28, 2001

(65) Prior Publication Data

US 2002/0013020 A1 Jan. 31, 2002

(30) Foreign Application Priority Data

Jul. 27, 2000 (KR) ........................................ 2000-43505

(51) Int. Cl.[7] .............................................. H01L 21/00
(52) U.S. Cl. ........................ 438/34; 438/148; 438/158; 438/155
(58) Field of Search .......................... 438/34, 149, 158, 438/155, 151, 161, 30

(56) References Cited

U.S. PATENT DOCUMENTS 6,338,989 B1 * 1/2002 Ahn ........................... 438/158

FOREIGN PATENT DOCUMENTS

JP            2000002892        *    4/1999

OTHER PUBLICATIONS

Han et al. ,"A TFT manufactured by 4 masks process with new photolithography", Asia Display, pp. 1109–1112, 1998.*

* cited by examiner

*Primary Examiner*—Carl Whitehead, Jr.
*Assistant Examiner*—Yennhu B. Huynh
(74) *Attorney, Agent, or Firm*—McGuireWoods LLP; Hae-Chan Park

(57) ABSTRACT

In a method of fabricating a thin film transistor array substrate, an aluminum-based conductive layer is deposited onto an insulating substrate, and patterned to form a gate line assembly. The gate line assembly includes gate lines, gate electrodes, and gate pads. A gate insulating layer is formed on the substrate with the gate line assembly. A semiconductor layer, and an ohmic contact layer are sequentially formed on the gate insulating layer. A double-layered conductive film with a chrome-based under-layer and an aluminum-based over-layer is deposited onto the substrate, and patterned to form a data line assembly. The data line assembly includes data lines crossing over the gate lines, source electrodes, drain electrodes, and data pads. The chrome-based under-layer of the conductive film is patterned through dry etching while using $Cl_2$ or HCl as the dry etching gas. A protective layer is deposited onto the substrate, and patterned to thereby form contact holes exposing the drain electrodes, the gate pads, and the data pads. Indium zinc oxide is deposited onto the substrate, and patterned to thereby form pixel electrodes connected to the drain electrodes through the corresponding contact holes, and subsidiary gate and data pads connected to the gate and data pads through the corresponding contact holes.

14 Claims, 33 Drawing Sheets

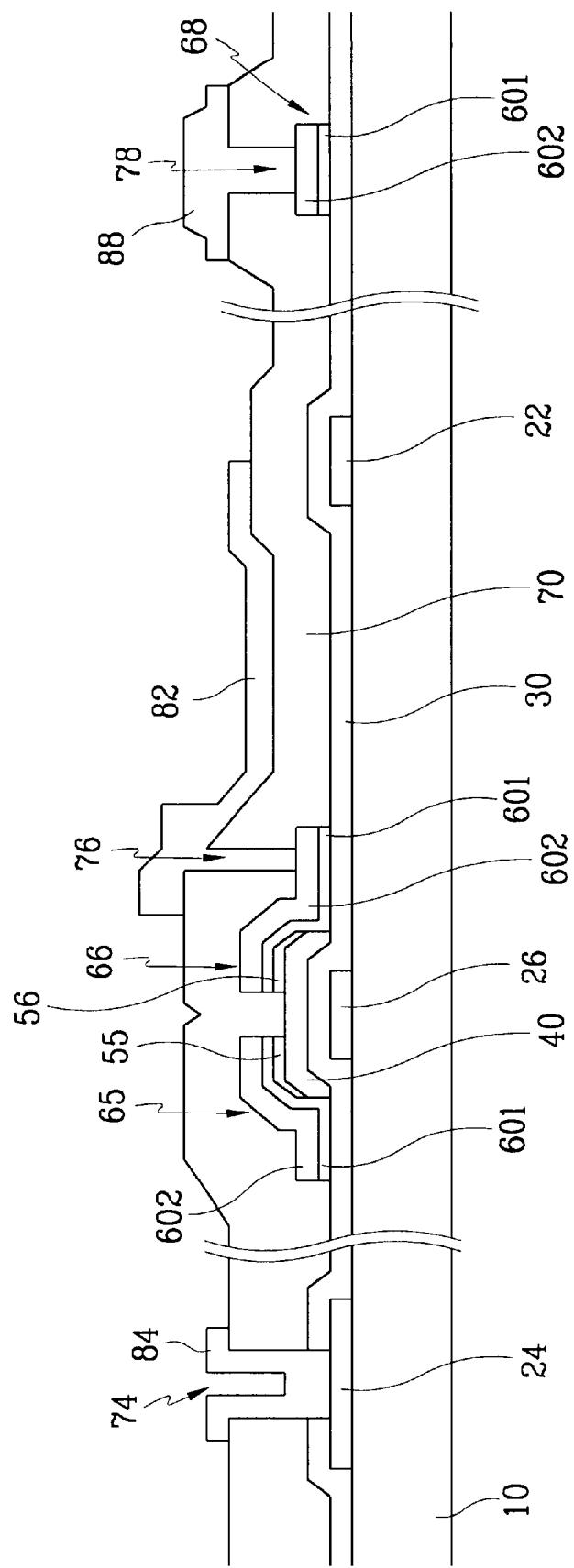

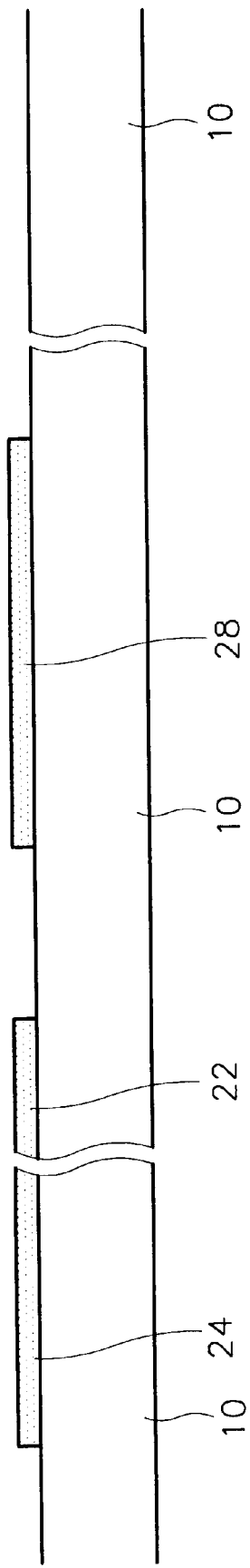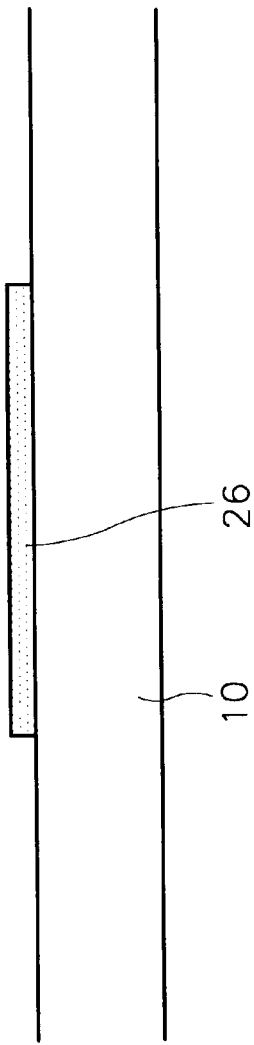

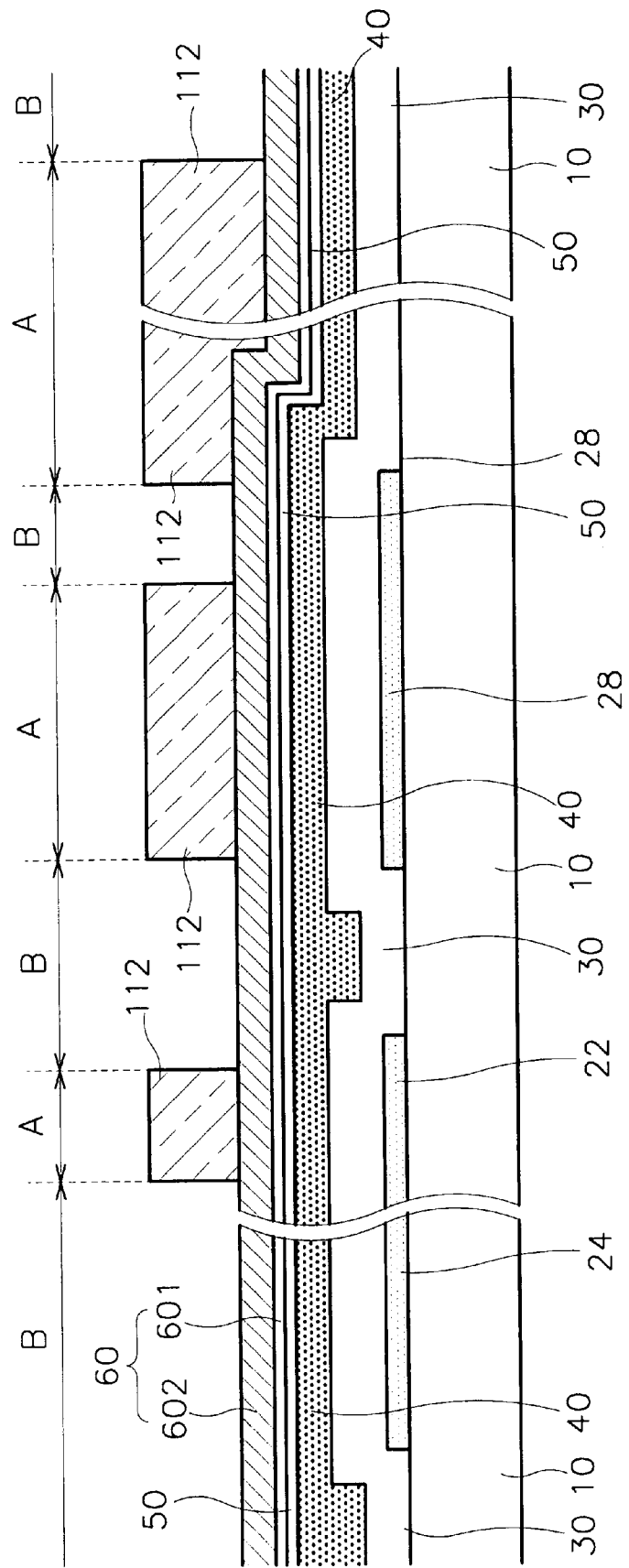

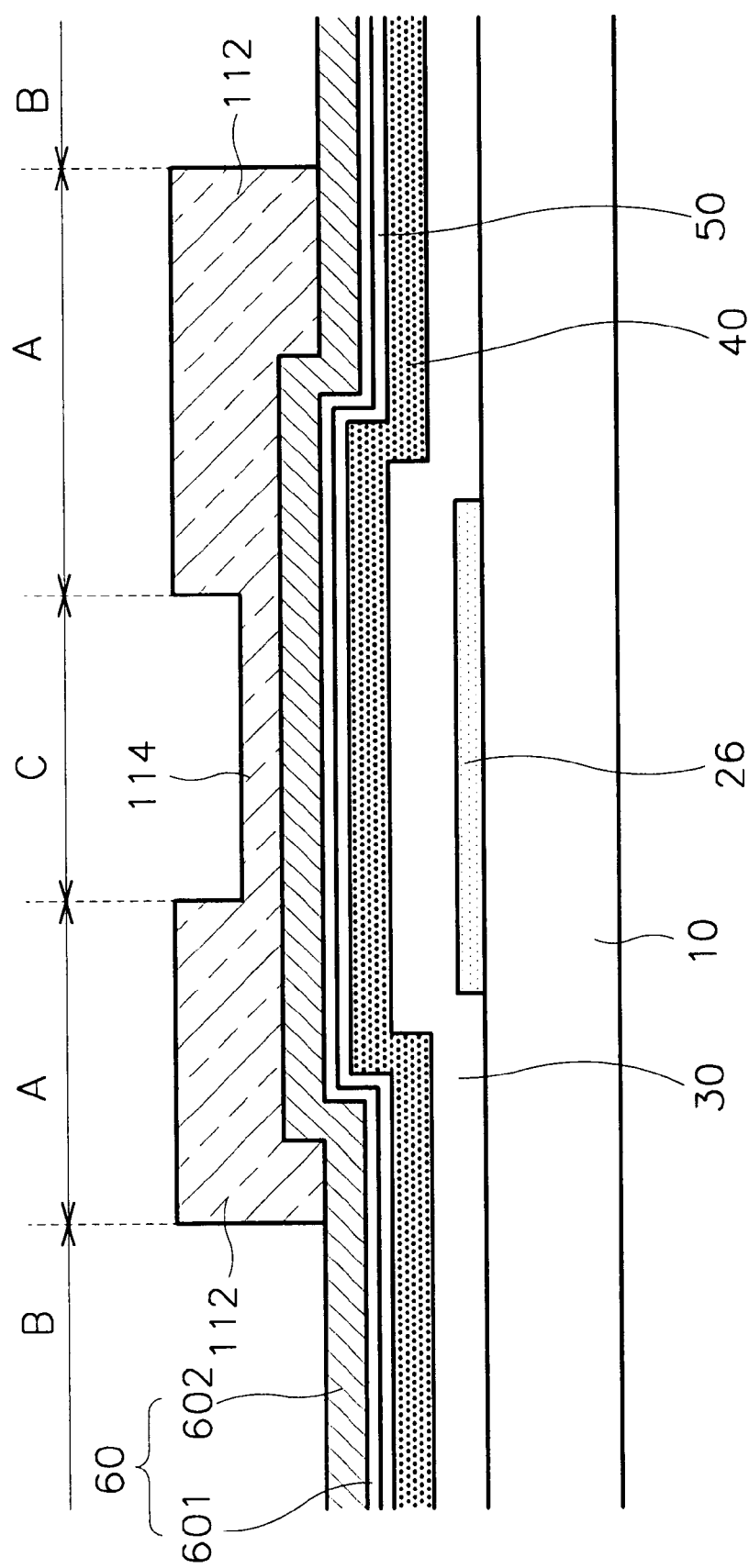

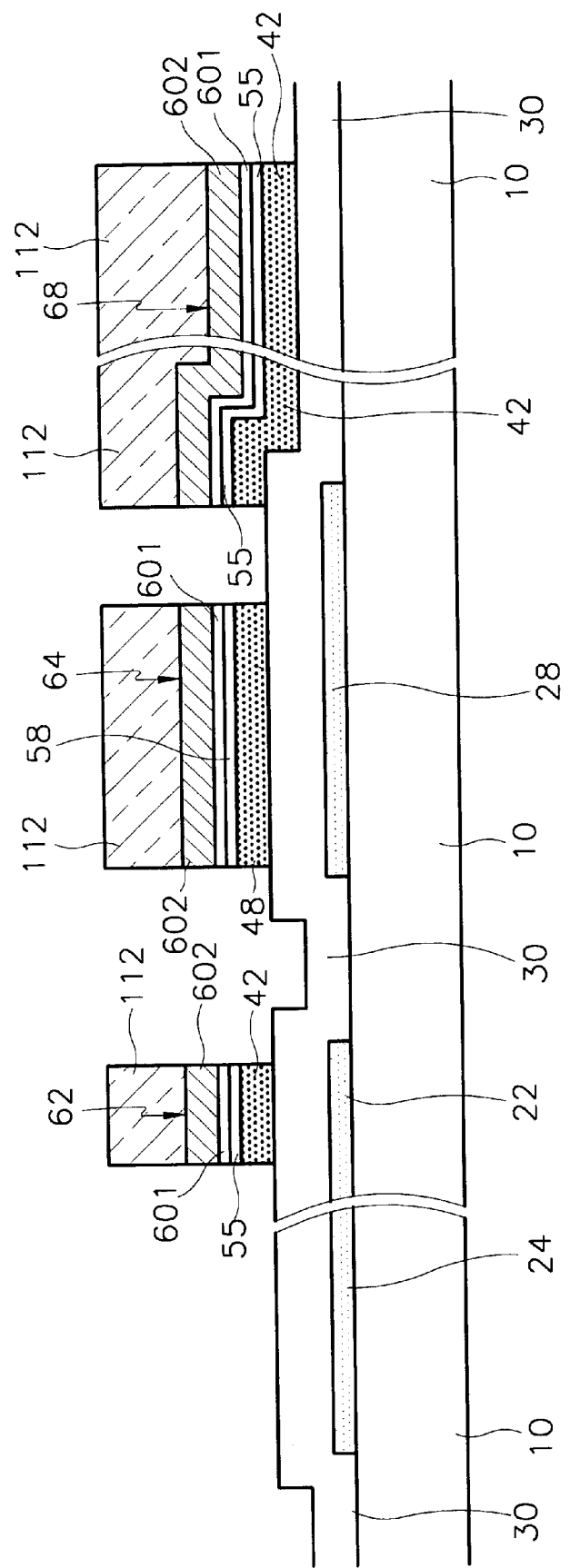

Ci - 300Å

Ni a-Si

Cr - 300Å

Ni a-Si

Etching Profile: about 25~3 °

METHOD FOR FABRICATING A THIN FILM TRANSISTOR ARRAY SUBSTRATE FOR LIQUID CRYSTAL DISPLAY

BACKGROUND OF THE INVENTION (a) Field of the Invention

The present invention relates to a thin film transistor (TFT) array substrate for a liquid crystal display and a method for fabricating the same and, more particularly, to a TFT array substrate that can be fabricated through simplified processing steps while ensuring good performance characteristics.

(b) Description of the Related Art

Generally, a liquid crystal display (LCD) is formed with two glass substrates, and a liquid crystal sandwiched between the substrates.

One of the substrates has a common electrode, a color filter and a black matrix, and the other substrate has pixel electrodes and thin film transistors (TFTs). The former substrate is usually called the "color filter substrate," and the latter substrate called the "TFT array substrate."

In a liquid crystal display, lower resistance materials such as aluminum or aluminum alloy are commonly used for wiring lines in order to prevent signal transmission delays. However, in the TFT array substrate, a transparent conductive material such as indium tin oxide (ITO) is used to form pixel electrodes or to reinforce pad portions. However, ITO shows very poor contact characteristic with respect to the aluminum-based material. In this respect, a separate material should be provided between the ITO and the aluminum-based material, and in the pad portions, the aluminum-based material should be removed to prevent corrosion thereof. This involves complicated processing steps. Furthermore, when an aluminum-based layer contacts a silicon-based semiconductor layer, the aluminum content tends to be diffused through the semiconductor layer. In order to solve such a problem, it is required that a separate layer based on other metallic material should be provided between the aluminum-based layer and the silicon-based layer. This requires a multiple-layered structure having different etching conditions.

On the other hand, the TFT array substrate is usually fabricated through photolithography based on a plurality of masks. In order to reduce the production cost, the number of masks should be reduced while obtaining the same or better performance characteristic of the device.

SUMMARY OF THE INVENTION

It is an object of the present invention to provide a TFT array substrate, and a method for fabricating the TFT array substrate that involves good contact characteristics while bearing wiring lines with lower resistance.

It is another object of the present invention to provide a method for fabricating a TFT array substrate that involves simplified processing steps.

These and other objects may be achieved in the following way.

A conductive layer connected to an aluminum-based layer is formed of indium zinc oxide (IZO), and a chrome based layer interposed between the aluminum-based layer and a semiconductor layer is patterned through dry etching.

Specifically, in a method for fabricating a thin film transistor array substrate, an aluminum-based conductive layer is deposited onto an insulating substrate, and patterned to thereby form a gate line assembly. The gate line assembly includes gate lines, gate electrodes, and gate pads. A gate insulating layer, and a semiconductor layer are sequentially formed on the substrate with the gate line assembly. A double-layered conductive film with a chrome-based under-layer and an aluminum-based over-layer is deposited onto the substrate, and patterned to thereby form a data line assembly. At this time, the under-layer of the conductive film is patterned through dry etching. The data line assembly includes data lines crossing over the gate lines, source electrodes connected to the data lines, and drain electrodes separated from the source electrodes while interposing the gate electrodes. A protective layer is deposited onto the substrate, and patterned to form first contact holes over the drain electrodes. Pixel electrodes are formed on the protective layer while electrically connected to the drain electrodes.

The pixel electrodes are formed with a transparent conductive material such as IZO. The under-layer of the conductive film has a thickness of 300 Å or less. The dry etching gas for etching the under-layer of the conductive film contains $Cl_2$ or $HCl$.

The gate line assembly further includes gate pads receiving scanning signals from the outside and transmitting the scanning signals to the gate lines. The data line assembly further includes data pads receiving picture signals from the outside and transmitting the picture signals to the data lines. The protective layer is further provided with second and third contact holes exposing the data pads, and the gate pads together with the gate insulating layer. Subsidiary gate and data pads are formed at the same plane as the pixel electrodes while being electrically connected to the gate and data pads through the second and third contact holes.

The data line assembly and the semiconductor layer are formed together through photolithography using photoresist patterns being partially differentiated in thickness. The photoresist patterns include a first pattern with a predetermined thickness, a second pattern with a thickness smaller than the thickness of the first pattern, and a third pattern with no thickness. The first photoresist pattern is placed over the data line assembly, and the second photoresist pattern is placed between the source and drain electrodes. The thickness of the second photoresist pattern is established to be one half or less of the first photoresist pattern.

The photoresist patterns are made using a mask. The mask has a first region with a predetermined light transmission, a second region with a light transmission lower than the light transmission of the first region, and a third region with a light transmission higher than the light transmission of the first region.

The mask is provided with a semi-transparent film or a slit pattern with a slit size smaller than the decomposition capacity range of light exposure to control the light transmission of the first to third regions in a different manner.

An ohmic contact layer may be provided in-between the semiconductor layer and the data line assembly. The data line assembly, the ohmic contact layer and the semiconductor layer may be patterned using one mask. In this case, the under-layer of the conductive film, the ohmic contact layer and the semiconductor layer are continuously patterned through dry etching.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIG. 2 is a cross sectional view of the TFT array substrate taken along the II–II' line of FIG. 1;

FIGS. 10B and 10C are cross sectional views of the TFT array substrate taken along the Xb–Xb' line and the Xc–Xc' line of FIG. 10A, respectively;

FIGS. 12B and 12C are cross sectional views of the TFT array substrate taken along the XIIb–XIIb' line and the XIIc–XIIc' line of FIG. 10A, respectively;

FIGS. 13A to 15A, and 13B to 15B are cross sectional view of the TFT array substrate taken along the XIIb–XIIb' line and the XIIc–XIIc' line of FIG. 12A at its fabricating step subsequent to that illustrated in FIGS. 12B and 12C;

DETAILED DESCRIPTION OF THE PREFERRED EMBODIMENTS

Preferred embodiments of this invention will be explained with reference to the accompanying drawings.

Figure 1:
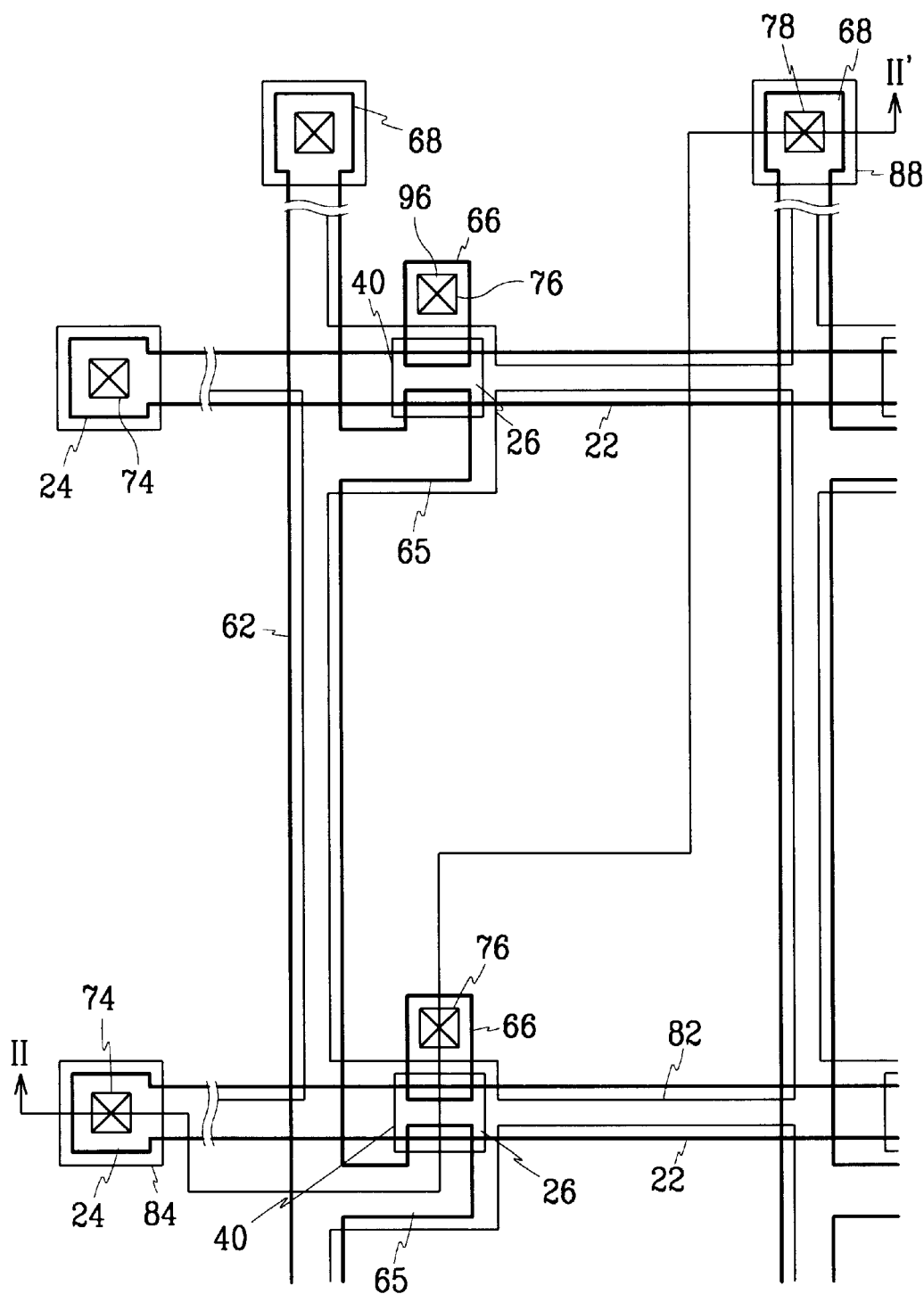
FIG. 1 is a plan view of a TFT array substrate for a liquid crystal display according to a first preferred embodiment of the present invention.

FIG. 1 is a plan view of a TFT array substrate for a liquid crystal display according to a first preferred embodiment of the present invention, and FIG. 2 is a cross sectional view of the TFT array substrate taken along the II–II' line of FIG. 1.

As shown in the drawings, a gate line assembly is formed on an insulating substrate 10 with an aluminum-based metallic material of lower resistance. The gate line assembly includes gate lines 22 proceeding in the horizontal direction, gate pads 24 connected to the end portions of the gate lines 22 to receive gate signals from the outside and transmit them to the gate lines 22, and gate electrodes 26 connected to the gate lines 22 to form TFTs.

A gate insulating layer 30 is formed on the substrate 10 with silicon nitride while covering the gate lines assembly. The gate insulating layer 30 has contact holes 74 exposing the gate pads 24 together with a protective layer 70 to be described later.

Semiconductor patterns 40 are formed on the gate insulating layer 30 over the gate electrodes 24 with amorphous silicon. Ohmic contact patterns 55 and 56 are formed on the semiconductor patterns 40 with $n^+$-hydrogenated amorphous silicon doped with silicide or n-type impurities of high concentration.

A data line assembly is formed on the ohmic contact patterns 55 and 56, and the gate insulating layer 30 with a metallic or conductive material such as Al or Al alloy, Mo or MoW alloy, Cr, and Ta. The data line assembly includes data lines 62 proceeding in the vertical direction while crossing over the gate lines 22 to define pixel areas, source electrodes 65 branched from the data lines 62 while extending over one ohmic contact patterns 55, data pads 68 connected to one sided end portions of the data lines 62 to receive picture signals from the outside, and drain electrodes 66 separated from the source electrodes 65 while interposing the gate electrodes 26 between them. The drain electrodes 66 is formed on the other ohmic contact patterns 56.

The data line assembly may have a single-layered structure with an aluminum-based layer, or a multiple-layered structure. When the data line assembly bears a multiple-layered structure, it is preferable that one of the layers is formed of a material of lower resistance, and the other layer is formed of a material having good contact characteristics with other materials. For example, a double-layered structure for the data line assembly may be formed with Cr and Al or Al alloy, or Al and Mo. In this preferred embodiment, the data line assembly is formed with a chrome-based under-layer 601, and an aluminum-based over-layer 602. The chrome-based layer 601 prevents the aluminum content of the over-layer 602 from diffusing through the silicon-based layers 40, 55 and 56.

The protective layer 70 is formed on the data line assembly and the semiconductor patterns 40 exposed through the data line assembly. The protective layer 70 is provided with first contact holes 74 exposing the gate pads 24 together with the gate insulating layer 30, and second and third contact holes 76 and 78 exposing the drain electrodes 66 and the data pads 68, respectively.

A pixel electrode assembly is formed on the protective layer 70 of indium zinc oxide (IZO). The pixel electrode assembly includes pixel electrodes 82 positioned at the pixel areas while being connected to the drain electrodes 66 through the second contact holes 76, and subsidiary gate and data pads 84 and 88 connected to the gate and data pads 24 and 68 through the first and third contact holes 74 and 78, respectively.

As shown in FIGS. 1 and 2, the pixel electrodes 82 are overlapped with the gate lines 22 to form storage capacitors.

If the desired amount of storage capacity is not obtained by the overlapping, storage capacitor lines may be additionally formed at the same plane as the gate line assembly.

In the resulting TFT array substrate, the gate line assembly and the data line assembly are respectively formed of an aluminum-based material of lower resistance, making it possible to employ the TFT array substrate for use in wide screen high definition liquid crystal displays. Furthermore, the gate and data pads 24 and 68, and the drain electrodes 66 formed of the aluminum-based material are connected to the subsidiary gate and data pads 84, and the pixel electrodes 82 of IZO through the contact holes 74, 76 and 78. This prevents corrosions at the pad portions while ensuring contact reliability.

A method for fabricating the above-structured TFT array substrate will be now explained with reference to FIGS. 3A through 6B.

Figure 3A:
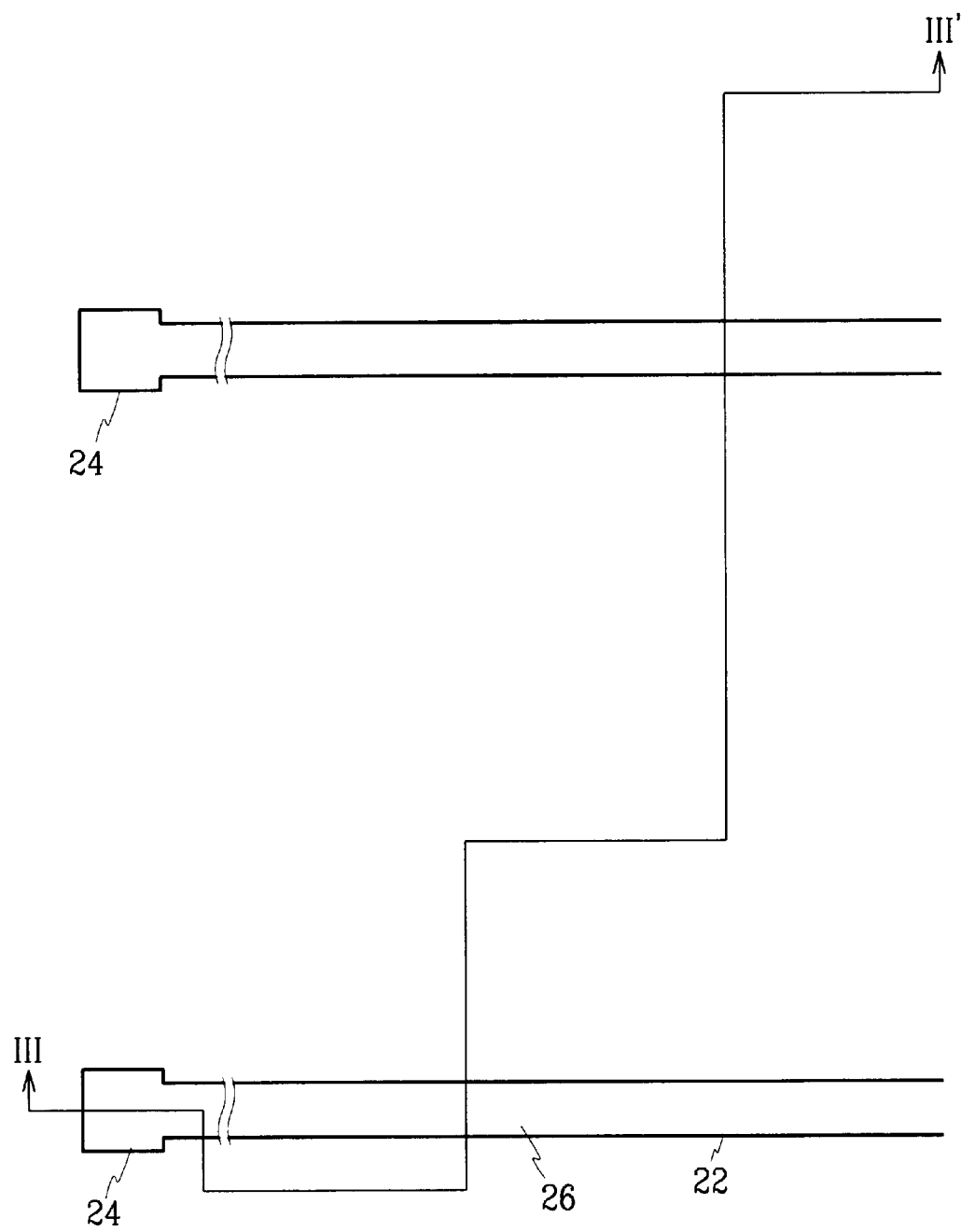
FIGS. 3A, 4A, 5A and 6A illustrate the steps of fabricating the TFT array substrate shown in FIG. 1 in a sequential manner.
Figure 3B:
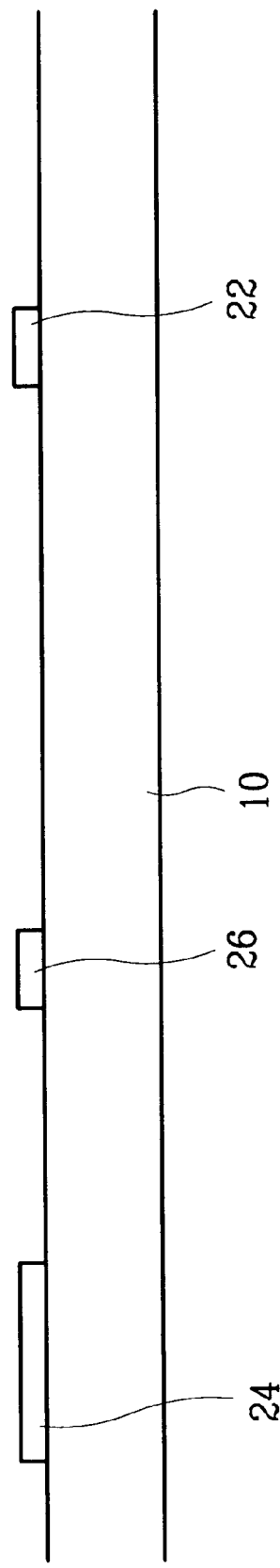
FIG. 3B is a cross sectional view of the TFT array substrate taken along the III–III' line of FIG. 3A.

As shown in FIGS. 3A and 3B, an aluminum-based conductive layer is deposited onto an insulating substrate 10 to a thickness of about 2500 Å, and patterned to form a gate line assembly. The gate line assembly includes gate lines 22, gate electrodes 26, and gate pads 24.

Figure 4A:
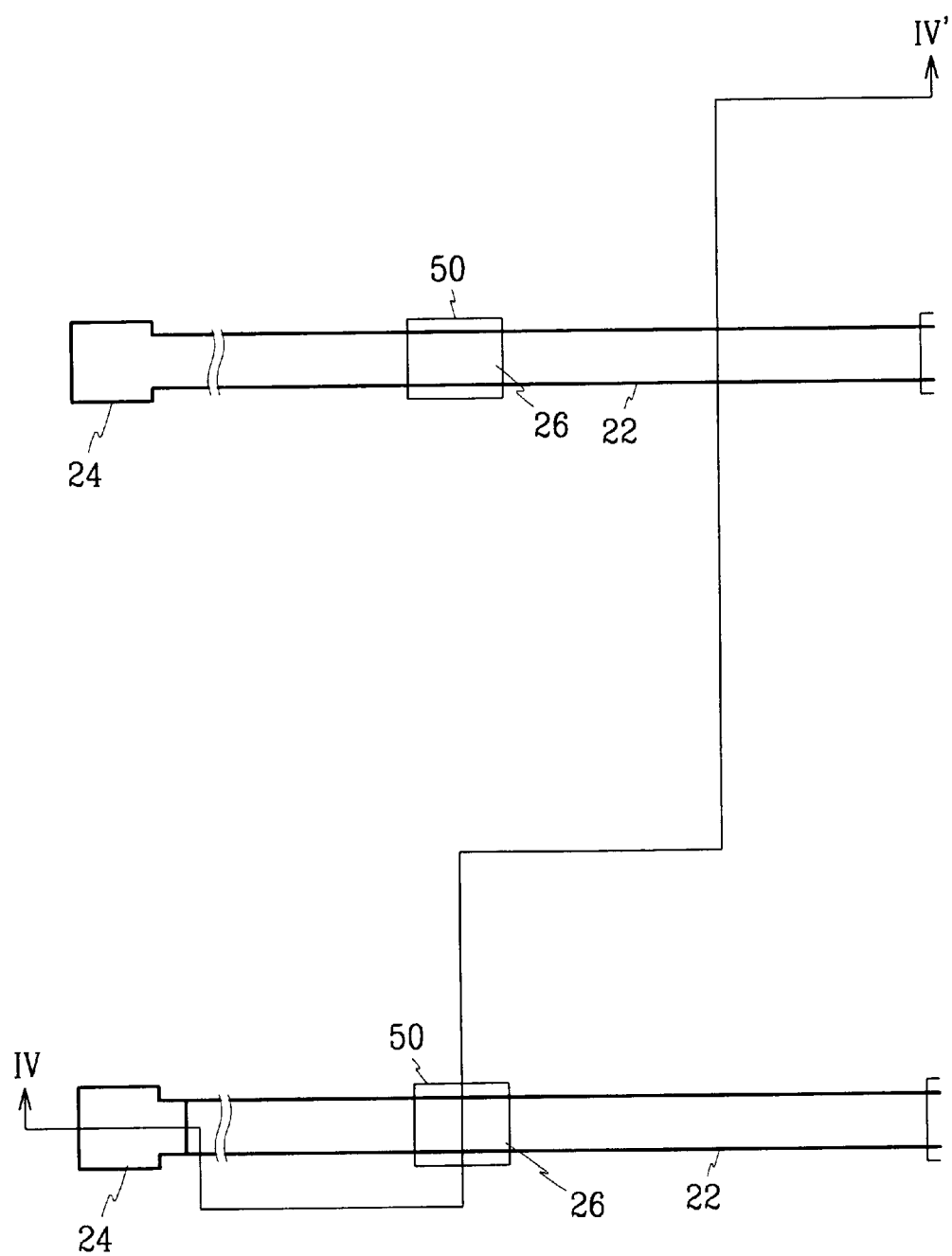
Figure 4B:
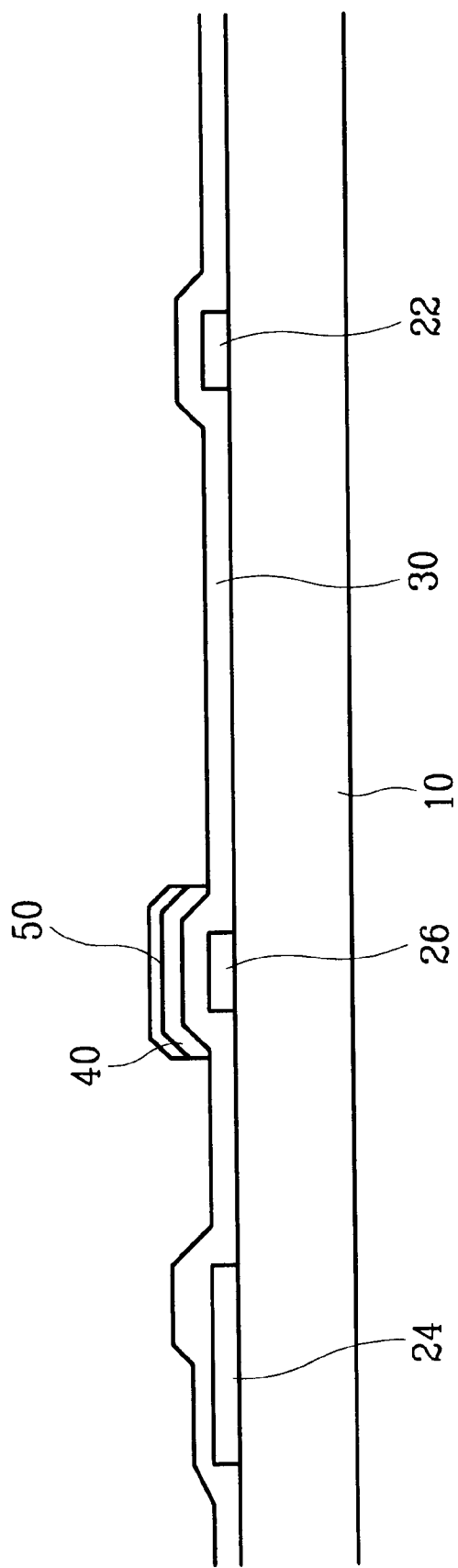
FIG. 4B is a cross sectional view of the TFT array substrate taken along the IVb–IVb' line of FIG. 4A.

As shown in FIGS. 4A and 4B, a gate insulating layer 30, an amorphous silicon-based semiconductor layer 40, and a doped amorphous silicon layer 50 are sequentially deposited onto the substrate 10 with the gate line assembly. The semiconductor layer 40, and the doped amorphous silicon layer 50 are patterned using a mask to thereby form semiconductor patterns 40 and ohmic contact patterns 50. At this time, the semiconductor patterns 40, and the ohmic contact patterns 50 are placed on the gate insulating layer 30 over the gate electrodes 26 while having an island shape.

Figure 5A:
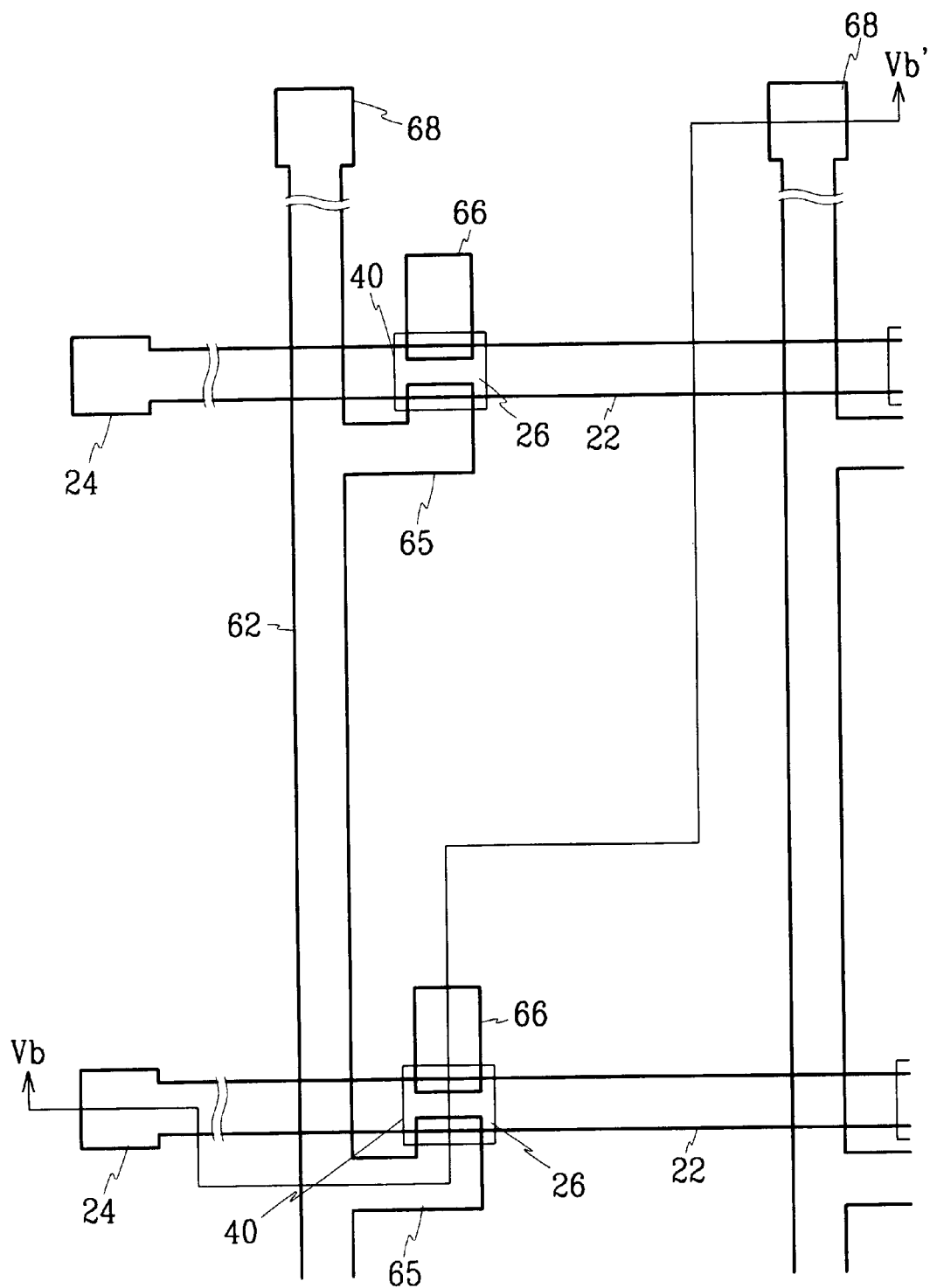
Figure 5B:
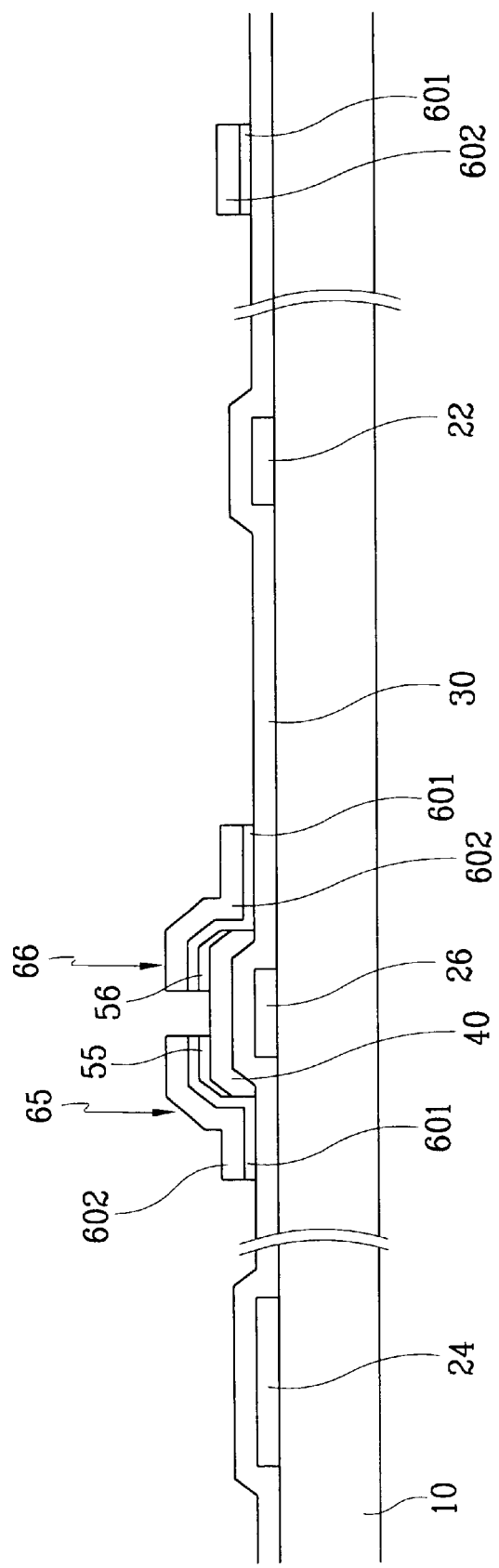
FIG. 5B is a cross sectional view of the TFT array substrate taken along the Vb–Vb' line of FIG. 5A

As shown in FIGS. 5A and 5B, a chrome-based under-layer 601 is deposited onto the substrate 10 to a thickness of about 300 Å, and an aluminum-based over-layer 602 deposited onto the under-layer 601 to a thickness of about 2500 Å. The under and over-layers 601 and 602 are patterned using a mask to form a data line assembly. The data line assembly includes data lines 62 crossing over the gate lines 22, source electrodes 65 connected to the data lines 62 while being extended over the gate electrodes 26, data pads 68 connected to one end portions of the data lines 62, and drain electrodes 66 separated from the source electrodes 65 while interposing the gate electrodes 26. The aluminum-based over-layer 602 may be patterned by wet or dry-etching. The chrome-based under-layer 601 is dry-etched. For that purpose, the thickness of the under-layer 601 is preferably set to be 300 Å or less.

Thereafter, the ohmic contact patterns 50 exposed through the data line assembly are etched to form ohmic contact patterns 55 and 56 separated around the gate electrode 26 while partially exposing the semiconductor patterns 40. At this time, in order to stabilize the exposed surface of the semiconductor patterns 40, oxygen plasma is preferably applied thereto.

Figure 6A:
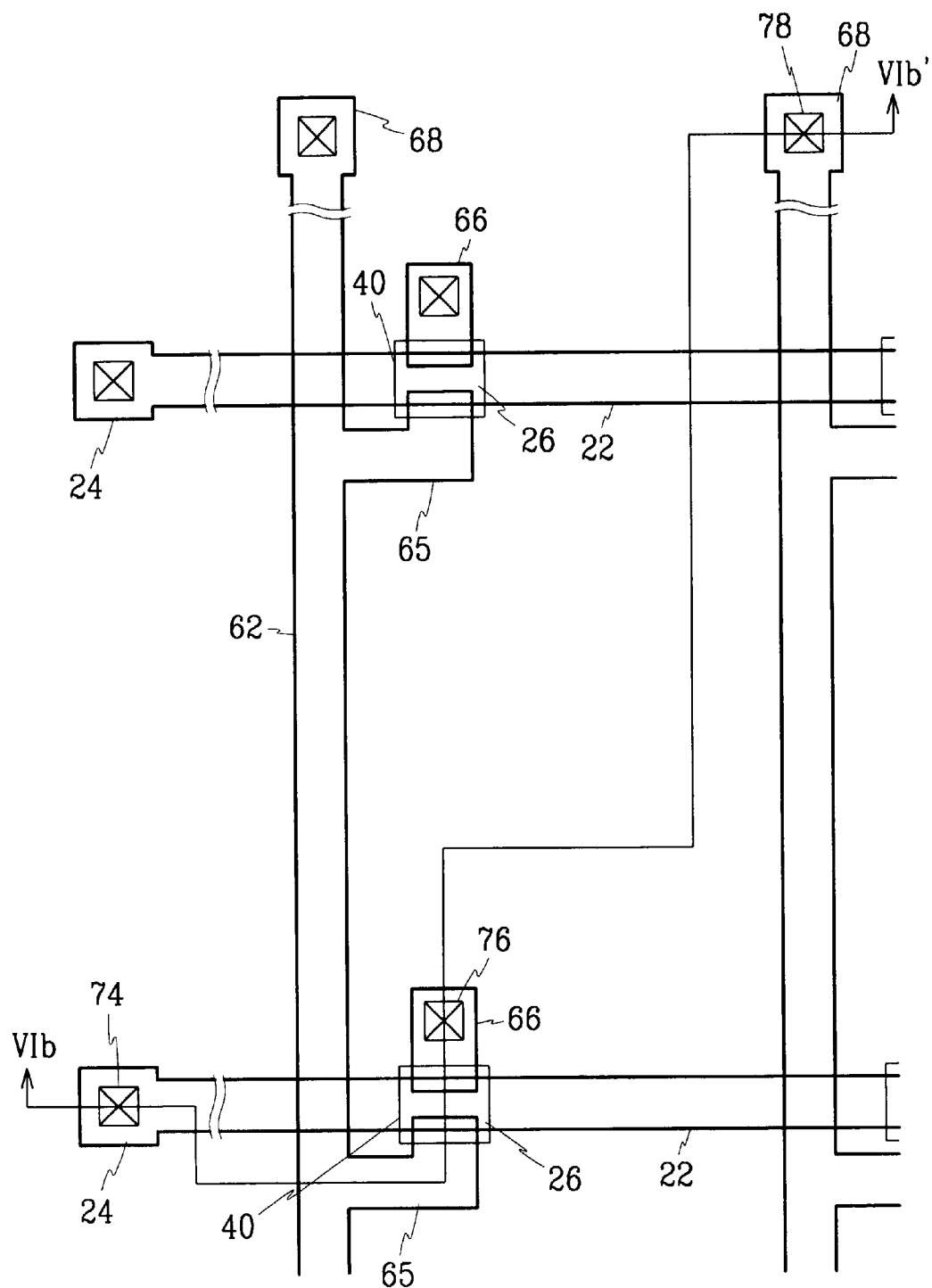
Figure 6B:
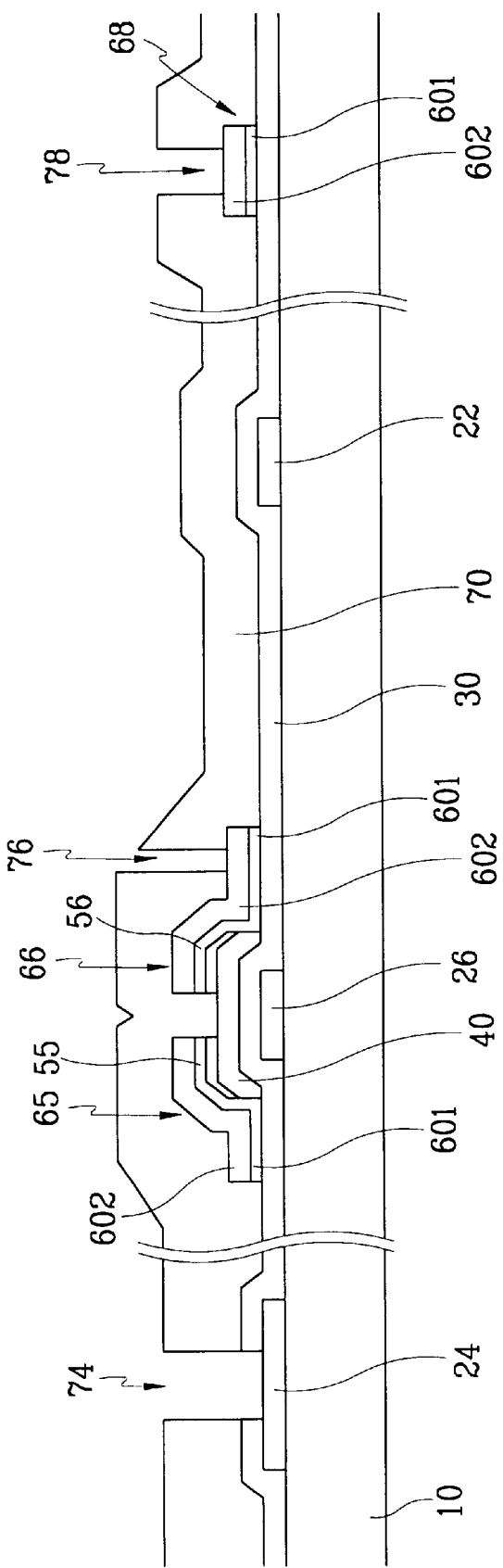
FIG. 6B is a cross sectional view of the TFT array substrate taken along the VIb–VIb' line of FIG. 6A.

As shown in FIGS. 6A and 6B, a protective layer 70 is deposited onto the substrate 10 with silicon nitride or organic insulating material, and dry-etched together with the underlying gate insulating layer 30 to form a first contact hole 74, a second contact hole 76 and a third contact hole 78 respectively exposing the gate pads 24, the drain electrodes 66, and the data pads 68. The gate pads 24, the drain electrodes 66, and the over-layer 602 of the data pads 68 exposed by the contact holes 74, 76 and 78 are dry-cleaned using $SF_6/O_2$. At this time, in order to minimize contact resistance between the aluminum-based layer and an IZO-based layer 82, 84 and 88 to be formed later, the remaining material over the aluminum-based layer 66, 24 and 68 may be removed through annealing. Furthermore, a separate layer of lower resistance containing $Al_xSi_x$ may be formed on the aluminum-based layer 66, 24, 68. Silicon may be introduced when the aluminum-based over-layer for the gate line assembly and the data line assembly is formed. The annealing process may be introduced in a separate manner after depositing the passivation layer 70, or performed together when the gate insulating layer 30 or the protective layer 70 is formed.

Finally, as shown in FIGS. 1 and 2, an IZO-based layer is deposited, and patterned through photolithography to thereby form pixel electrodes 82 connected to the drain electrodes 66 through the second contact holes 76, and subsidiary gate pad 84 and subsidiary data pad 88 connected to the gate pad 24 and the data pads 68 through the first contact hole 74 and the third contact hole 78.

In the method of fabricating the TFT array substrate, even though the transparent conductive patterns 82, 84 and 88 connected to the aluminum-based layers 601 and 24 are formed of IZO, corrosion does not occur at the contact area. Therefore, it is not required that the aluminum-based layer exposed through the contact holes is removed before the transparent conductive patterns 82, 84 and 88 are formed. This can simplify the steps of fabricating the TFT array substrate.

Figure 7:
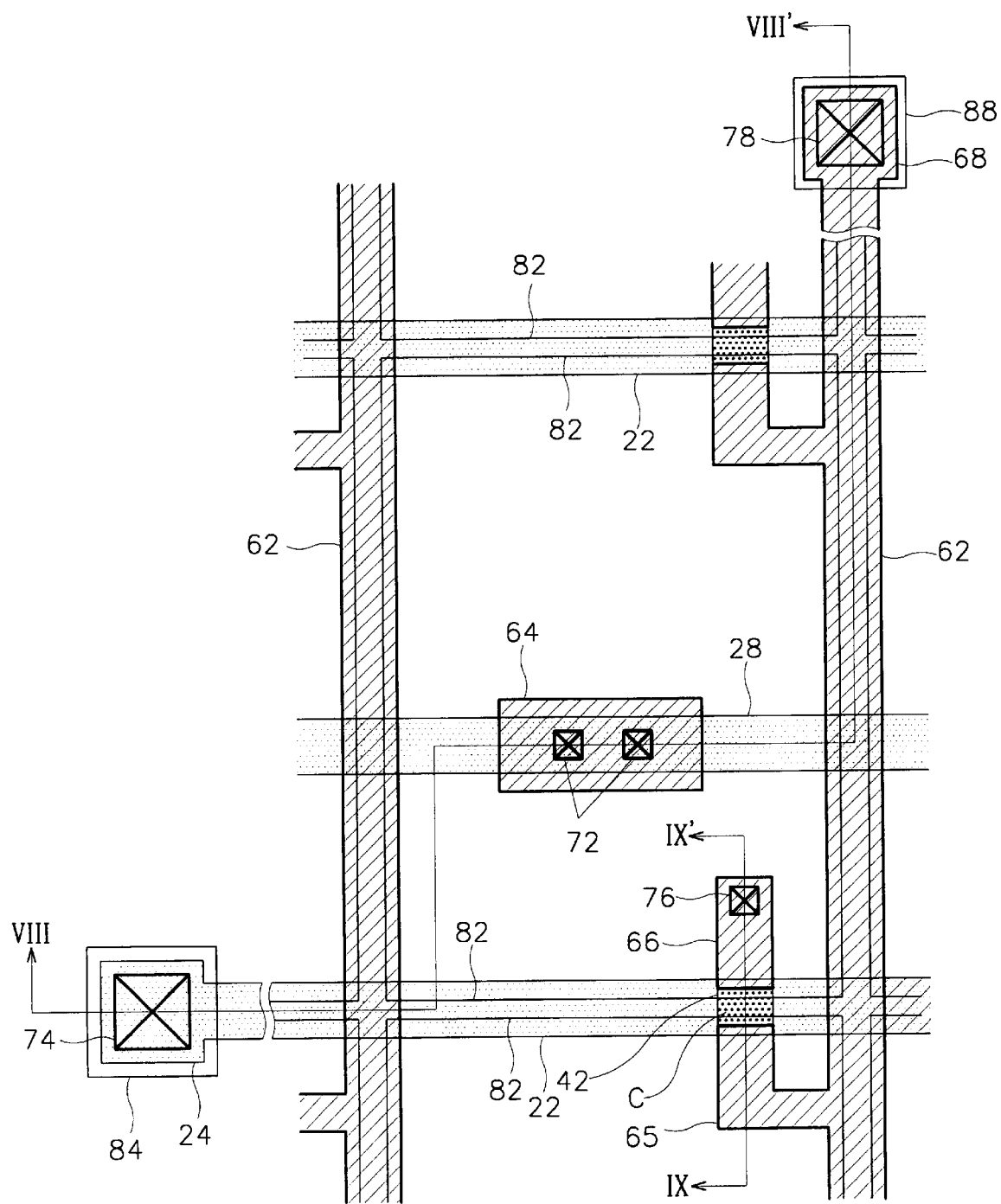
FIG. 7 is a plan view of a TFT array substrate for a liquid crystal display according to a second preferred embodiment of the present invention.
Figure 8:
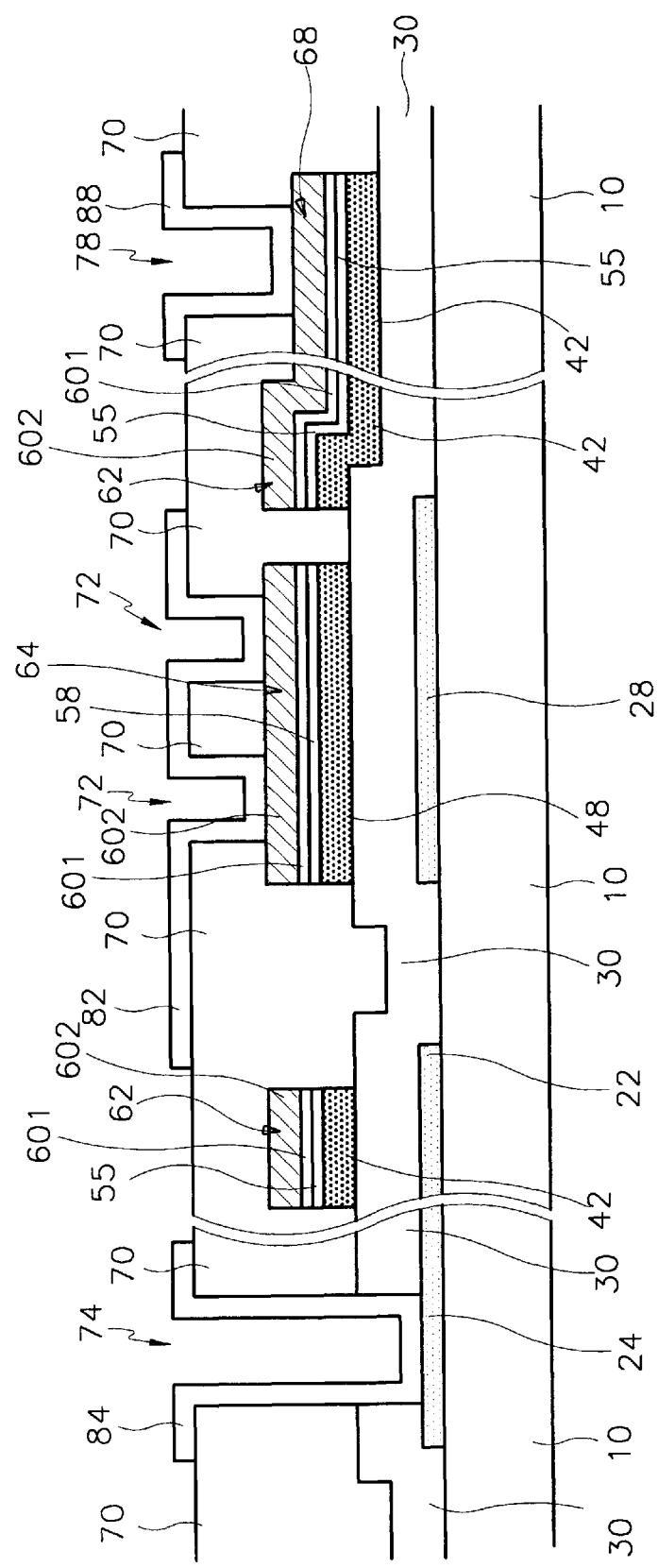
FIGS. 8 and 9 are cross sectional views of the TFT array substrate taken along the VIII–VIII' line and the IX–IX' line of FIG. 7, respectively.
Figure 9:
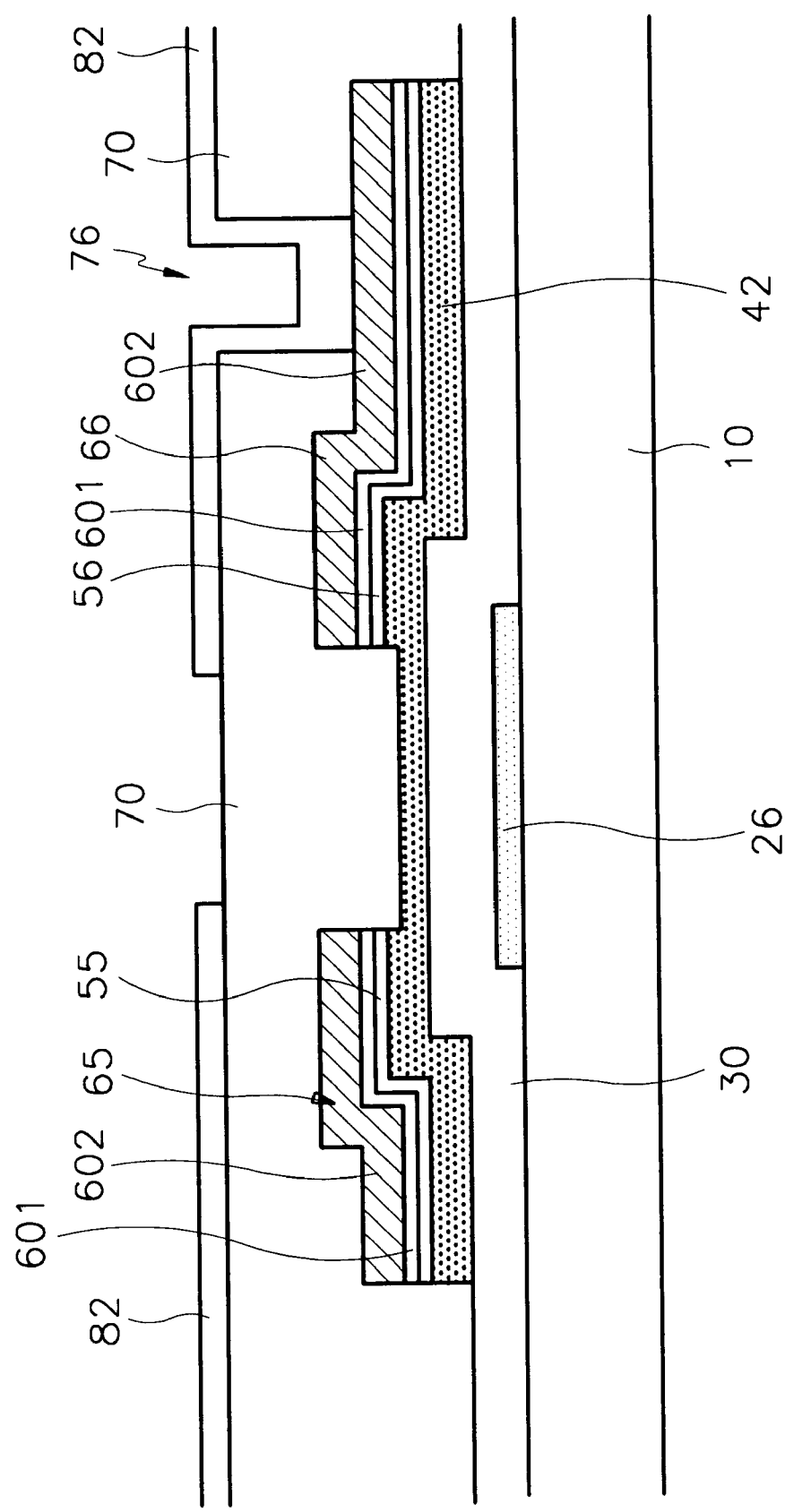

FIG. 7 is a plan view of a TFT array substrate according to a second preferred embodiment of the present invention. FIGS. 8 and 9 are cross sectional views taken along the VIII–VIII' line and the IX–IX' line of FIG. 7.

A gate line assembly is formed on an insulating substrate 10. The gate line assembly includes gate lines 22, gate pads 24, and gate electrodes 26. The gate line assembly further includes storage capacitor electrodes 28 proceeding parallel to the gate lines 22. The storage capacitor electrodes 28 are applied with common electrode voltage from the outside. The storage capacitor electrodes 28 are overlapped with storage capacitor conductive patterns 64 connected to pixel electrodes to be described later, thereby forming storage capacitors. If desired amount of storage capacity can be obtained by overlapping the pixel electrodes 82 with the gate lines 22, the storage capacitor electrodes 28 may be omitted.

A gate insulating layer 30 is formed on the substrate 10 with silicon nitride while covering the gate line assembly.

Semiconductor patterns 42 and 48 are formed on the gate insulating layer 30 with hydrogenated amorphous silicon. Ohmic contact patterns 55, 56 and 58 are formed on the semiconductor patterns 42 and 48 with amorphous silicon doped with n-type impurities such as phosphorous P at high concentration.

A data line assembly is formed on the ohmic contact patterns 55, 56 and 58 of aluminum-based conductive material of lower resistance. The data line assembly includes data lines 62 proceeding in the vertical direction, data pads 68 connected to one end portions of the data lines 62 to receive picture signals from the outside, and source electrodes 65 branched from the data lines 62 to form TFTs. The data line assembly further includes drain electrodes 66 separated from the source electrodes 65 while interposing the gate electrodes 26 between them, and storage capacitor conductive patterns 64 formed over the storage capacitor electrodes 28. When the storage capacitor electrodes 28 are not introduced, the storage capacitor conductive patterns 64 may be also omitted. The data line assembly is formed with a chrome-based under-layer 601, and an aluminum-based over-layer 602.

The ohmic contact patterns 55, 56 and 58 lower contact resistance between the underlying semiconductor patterns 42 and 48 and the overlying data line assembly, and have completely the same shape as the data line assembly. That is, the data line ohmic contact patterns 55 have the same shape as the data lines 62, the data pads 68, and the source electrodes 65. The drain electrode ohmic contact patterns 56 have the same shape as the drain electrodes 66. The storage capacitor ohmic contact patterns 58 have the same shape as the storage capacitor conductive patterns 64.

In the meantime, the semiconductor patterns 42 and 48 have the same shape as the data line assembly and the ohmic contact patterns 55, 56 and 57 except at the channel area C. Specifically, the storage capacitor semiconductor patterns 48, the storage capacitor conductive patterns 64 and the storage capacitor ohmic contact patterns 58 are the same in shape, but the TFT semiconductor patterns 42 differ in shape from the data line assembly and the corresponding ohmic contact patterns. That is, the source electrodes 65 and the drain electrodes 66 are separated from each other at the channel area C, and the ohmic contact patterns 55 and 56 are also separated from each other at the channel area C, whereas the TFT semiconductor patterns 42 proceed continuously at the channel area C to form channels for the TFTs.

A protective layer 70 is formed on the data line assembly, and provided with contact holes 71, 73 and 74 exposing the drain electrodes 66, the data pads 68, and the storage capacitor conductive patterns 64. The protective layer 70 further has contact holes 72 exposing gate pads 24 together with the gate insulating layer 30. The protective layer 70 may be formed with silicon nitride or acryl-based organic material.

Pixel electrodes 82 are formed on the protective layer 70 to receive picture signals from the TFTs and generate electric fields together with a common electrode for the color filter substrate. The pixel electrodes 82 are formed with a transparent conductive material such as IZO, and electrically connected to the drain electrodes 66 through the contact holes 71 to receive picture signals. The pixel electrodes 82 are overlapped with the neighboring gate and data lines 22 and 62 to enhance opening ratio, but they may not overlap each other. Furthermore, the pixel electrodes 82 are connected to the storage capacitor conductive patterns 64 through the contact holes 74 to transmit the picture signals thereto.

Meanwhile, subsidiary gate and data pads 84 and 88 are formed over the gate and data pads 24 while being connected thereto through the contact holes 72 and 73. The subsidiary gate and data pads 84 and 88 enhance adhesion with external circuits and protect the pads, but may be selectively introduced.

In the case of reflection-type liquid crystal displays, opaque conductive material instead of IZO may be used for forming the pixel electrodes 82.

A method for fabricating the TFT array substrate according to the second preferred embodiment where four masks are used in photolithography will be now explained with reference to FIGS. 10A through 16C.

Figure 10A:
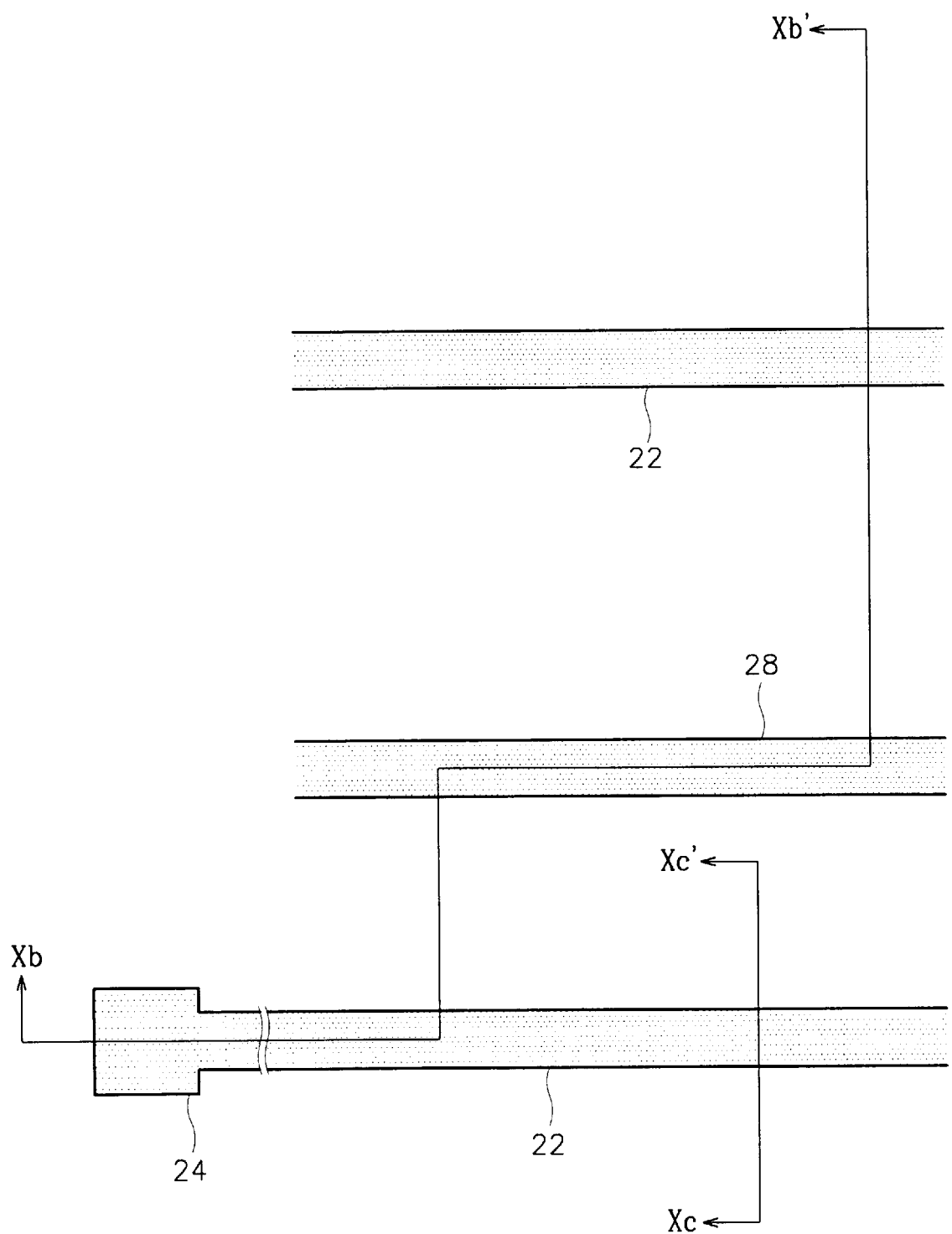
FIG. 10A is a plan view of the TFT array substrate shown in FIG. 7 at its initial fabricating process.

As shown in FIGS. 10A through 10C, an aluminum-based layer is deposited onto an insulating substrate 10, and patterned using a first mask to form a gate line assembly. The gate line assembly includes gate lines 22, gate pads 24, gate electrodes 26, and storage capacitor electrodes 28.

Figure 11A:
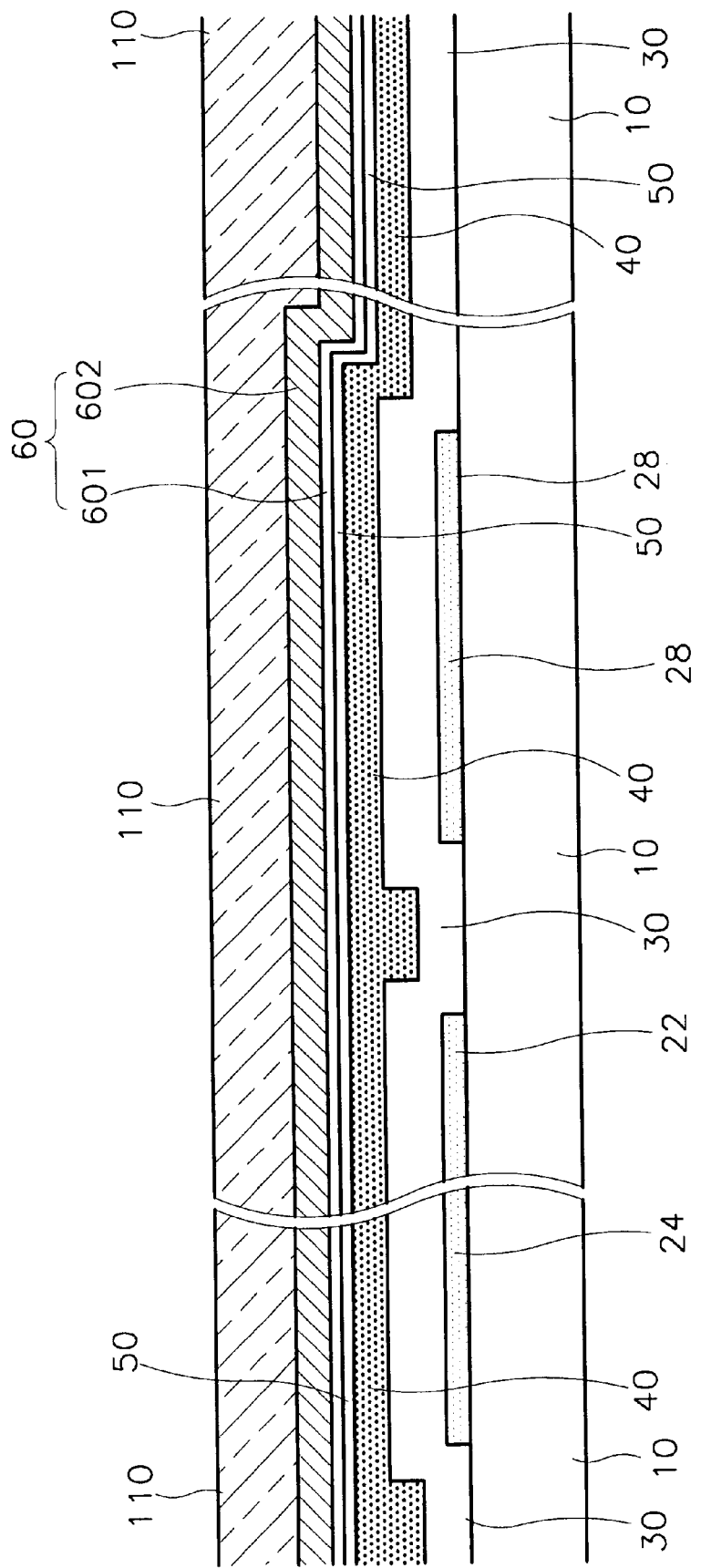
FIGS. 11A and 11B illustrate the step of fabricating the TFT array substrate subsequent to that illustrated in FIGS. 10B and 10C.
Figure 11B:
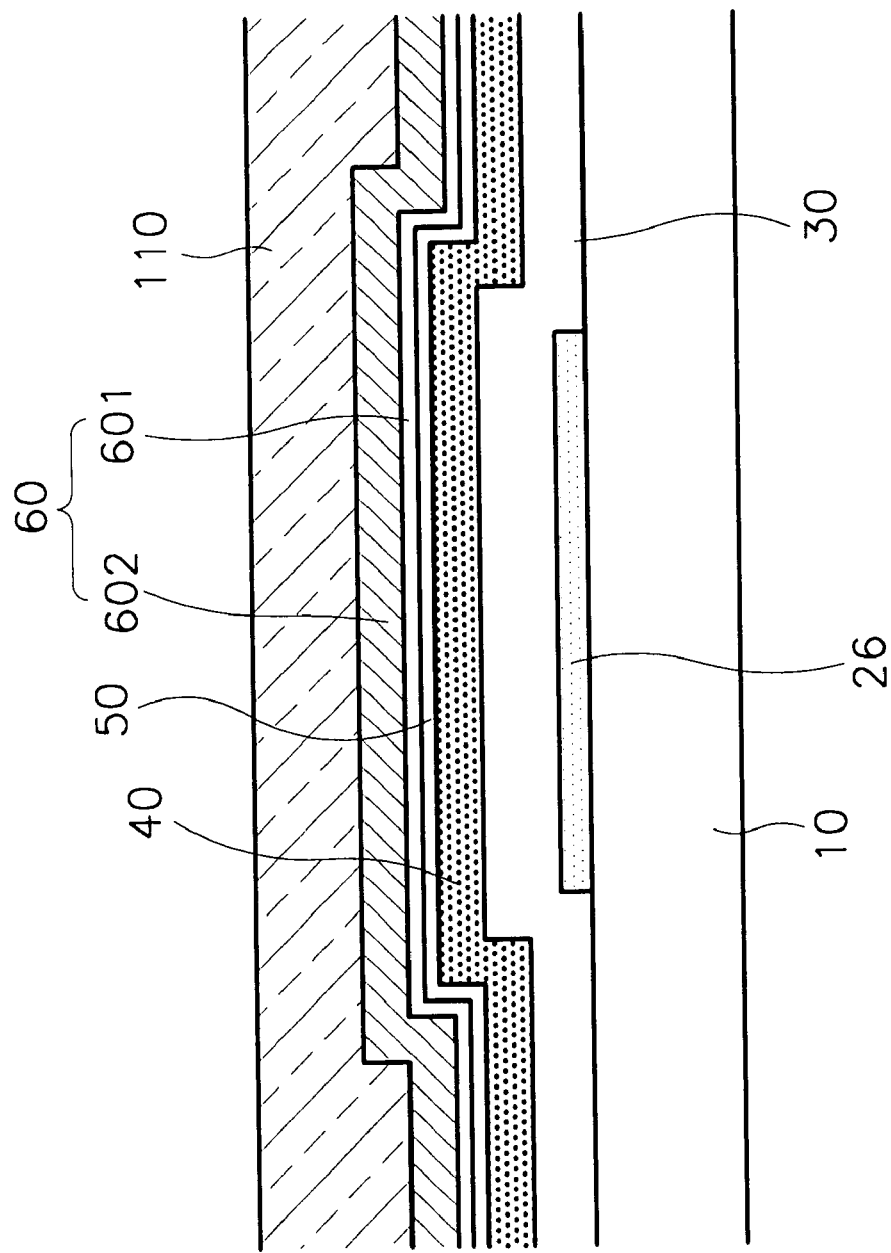

Thereafter, as shown in FIGS. 11A and 11B, a gate insulating layer 30, a semiconductor layer 40, and an ohmic contact layer 50 are sequentially deposited onto the substrate 10 through chemical vapor deposition. The gate insulating layer 30 is 1500–5000 Å thick. The semiconductor layer 40 is 500–2000 Å thick, and the ohmic contact layer 50 is 300–600 Å thick. A double-layered conductive film 60 with a chrome-based under-layer 601 and an aluminum-based over-layer 602 is formed on the substrate 10 through sputtering such that it has a thickness of 1500–3000 Å. A photoresist film 110 is coated onto the conductive film 60 with a thickness of 1–2 $\mu$m. The under-layer 601 has a thickness of 300 Å or less to easily perform dry-etching.

Figure 12A:
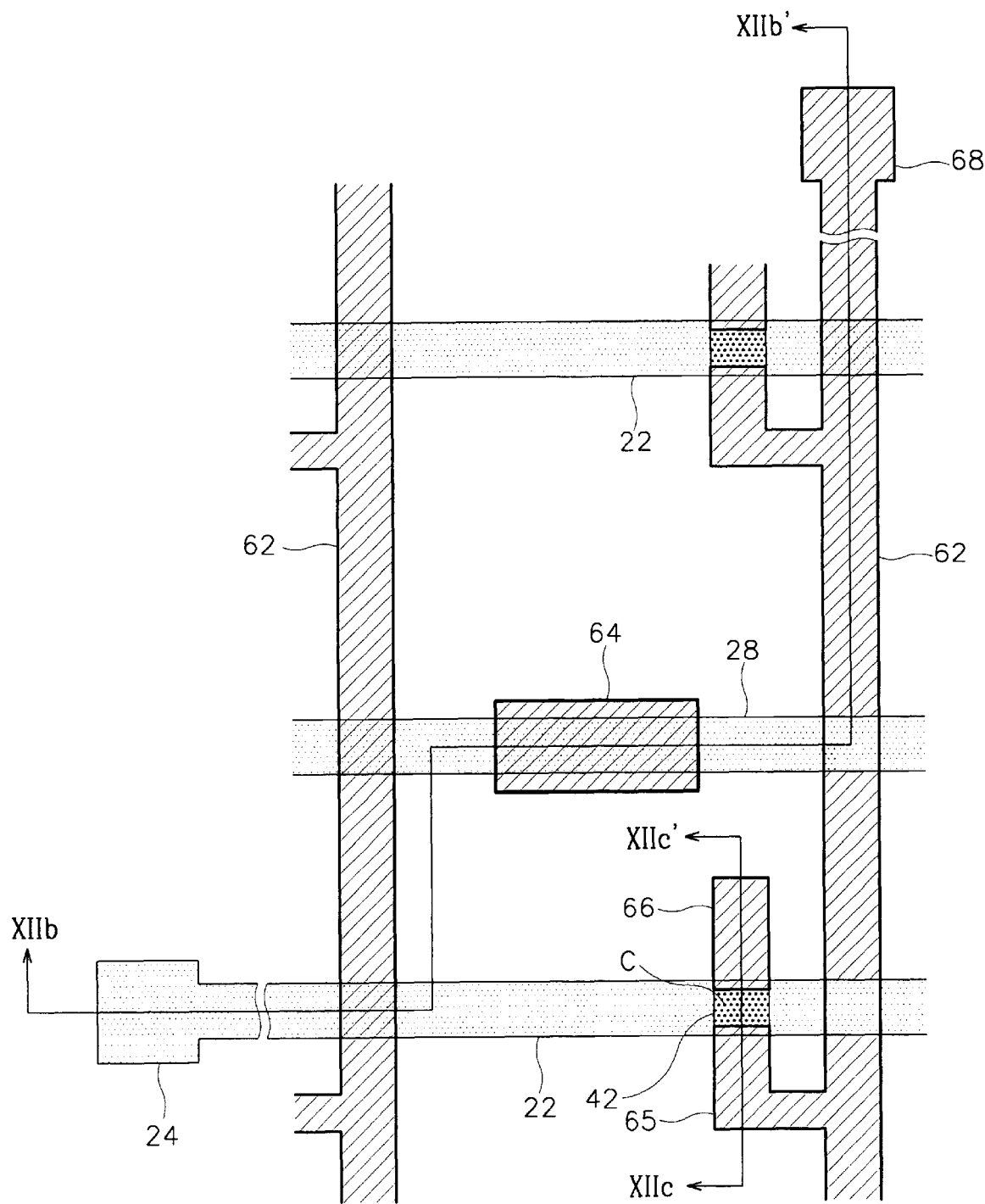
FIG. 12A is a plan view of the TFT array substrate at its fabricating step subsequent to that illustrated in FIGS. 11A and 11B.

Then, as shown in FIGS. 12B and 12C, the photoresist film 110 is exposed to light through a second mask, and developed to thereby form first and second photoresist patterns 112 and 114. At this time, the second photoresist pattern 114 positioned at the channel area C between the source and drain electrodes 65 and 66 has a thickness smaller than that of the first photoresist pattern 112 positioned at the data line assembly area A. The photoresist film 110 positioned at the remaining area B is entirely removed. Provided that the thickness ratio between the first and second photoresist patterns 112 and 114 should be differentiated depending upon the subsequent processing conditions, the thickness of the second photoresist pattern 114 is preferably established to be one half or less of the first photoresist pattern 112. For instance, the second photoresist pattern 114 may have a thickness of 4000 Å or less.

Various techniques may be employed to have the photoresist patterns get different thickness. In order to control light transmission of the mask at the A area, a slit or lattice pattern is mainly formed at that area, or a semi-transparent film is provided at that area.

In the case of the slit pattern, the width of each slit is preferably narrower than the decomposition capacity range of the light exposure. In the case of the semi-transparent film, a thin film having different light transmission or thickness may be used in fabricating a mask to control the light transmission.

When a photoresist film is exposed to light using such a mask, the high molecules at the light-exposed area are completely decomposed, the high molecules at the area of the slit pattern or the semi-transparent film are decomposed slightly, and the high molecules at the light-intercepted area are scarcely decomposed. When the photoresist film is developed, the remaining portions have different thickness depending upon the molecular decomposition degrees. However, a long exposure to light may decompose all the molecules. Therefore, the exposure time should be controlled in an appropriate manner.

Alternatively, such a photoresist pattern with a relatively thin thickness can be obtained using a photoresist film capable of reflowing. The photoresist film is exposed to light through a usual mask with a transparent portion and an opaque portion, and developed. Then, the photoresist film is reflown to have the remaining film portion spread to the removed portion.

Thereafter, the photoresist pattern 114, and the underlying conductive film 60, ohmic contact layer 50 and semiconductor layer 40 are etched. At this time, the data line assembly and the underlying layers are entirely left at the data line assembly area A, only the semiconductor layer is left at the channel area C, and only the gate insulating layer 30 is left at the remaining area B.

Figure 13A:
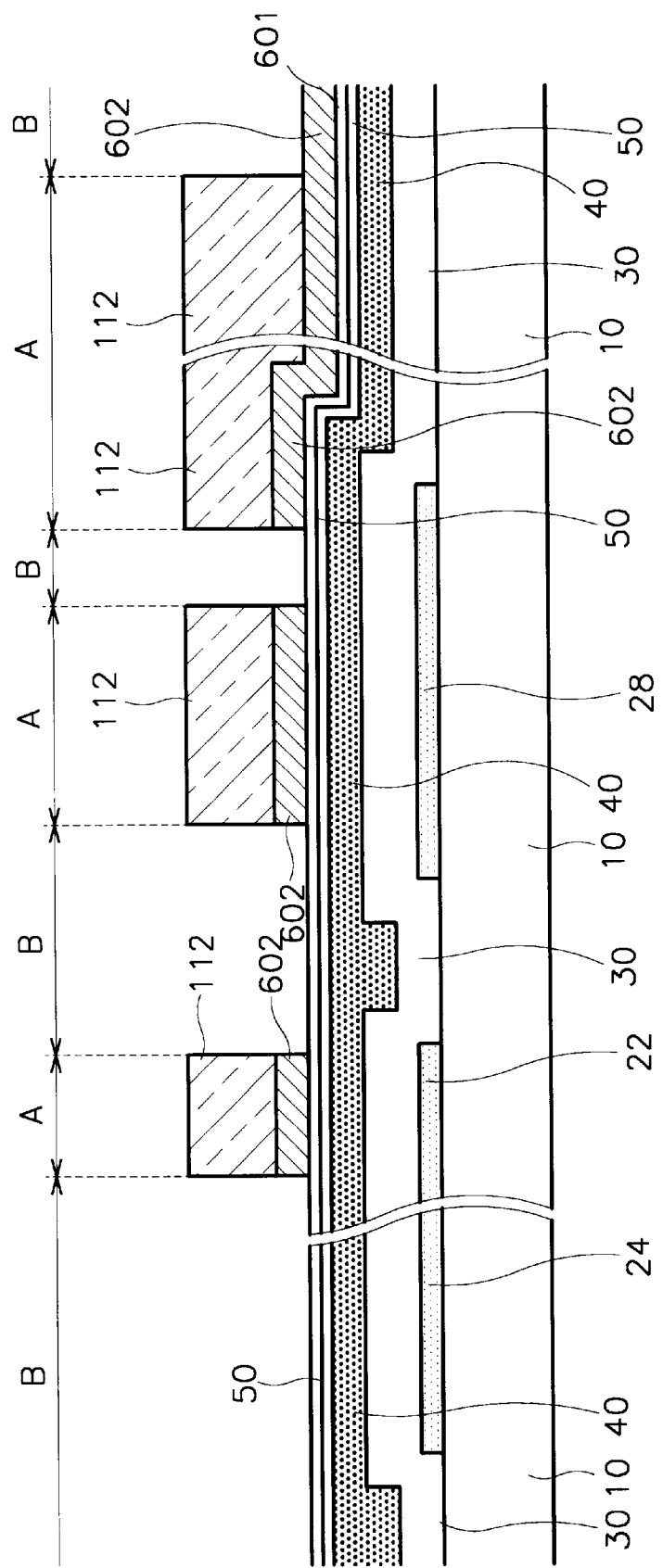
Figure 13B:
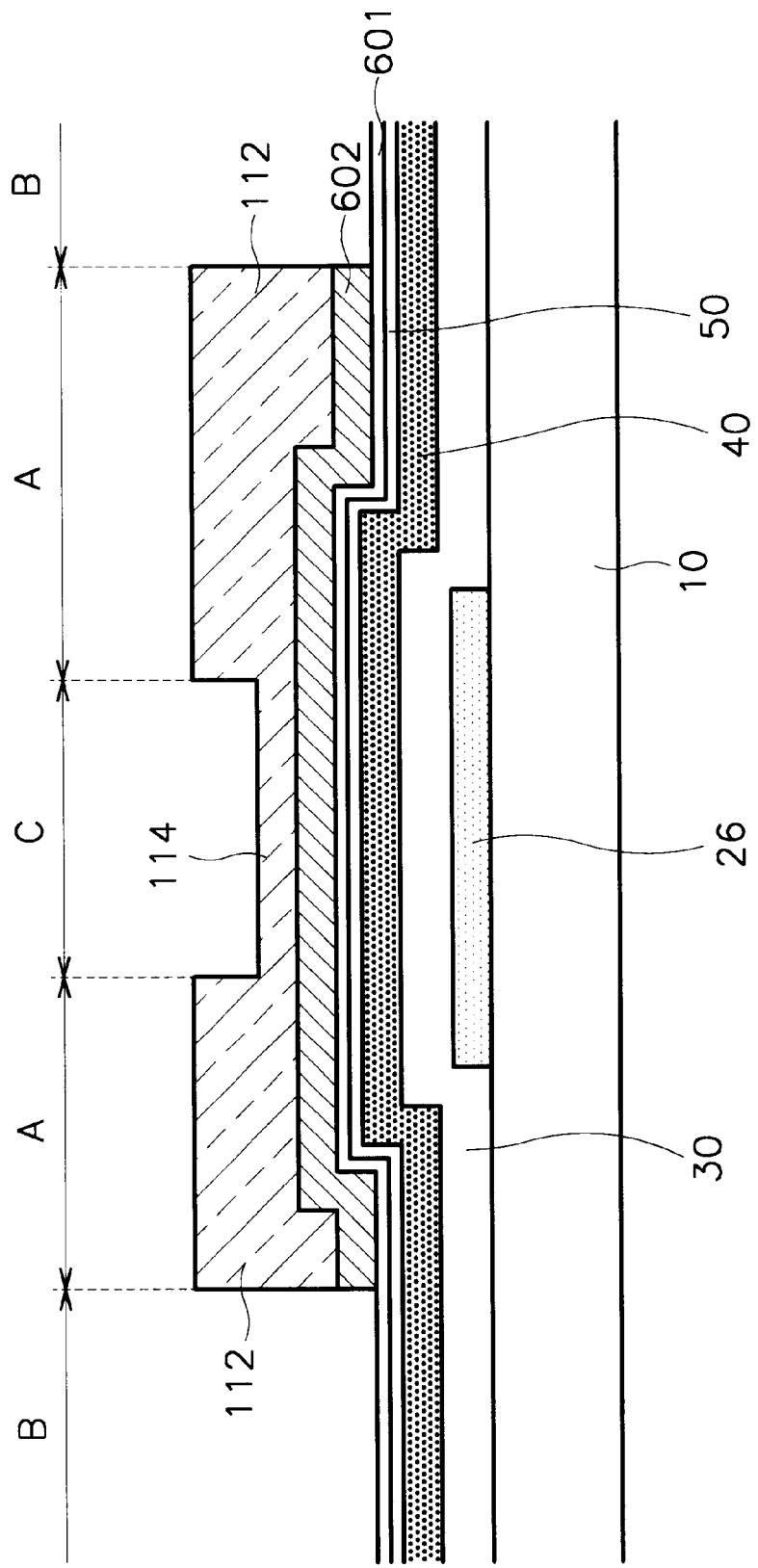

In this process, as shown in FIGS. 13A and 13B, the aluminum-based over-layer 602 of the conductive film 60 exposed at the B area is first removed through dry or wet-etching.

Figure 14A:
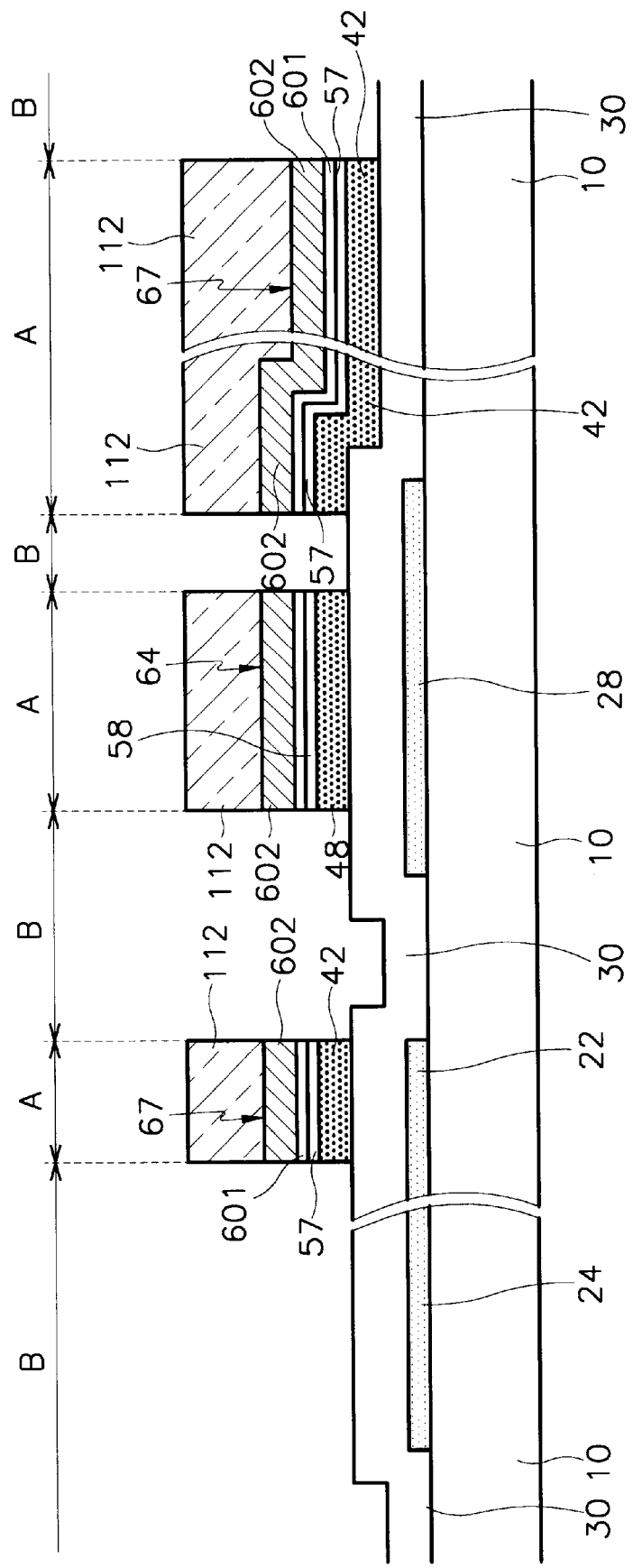
Figure 14B:
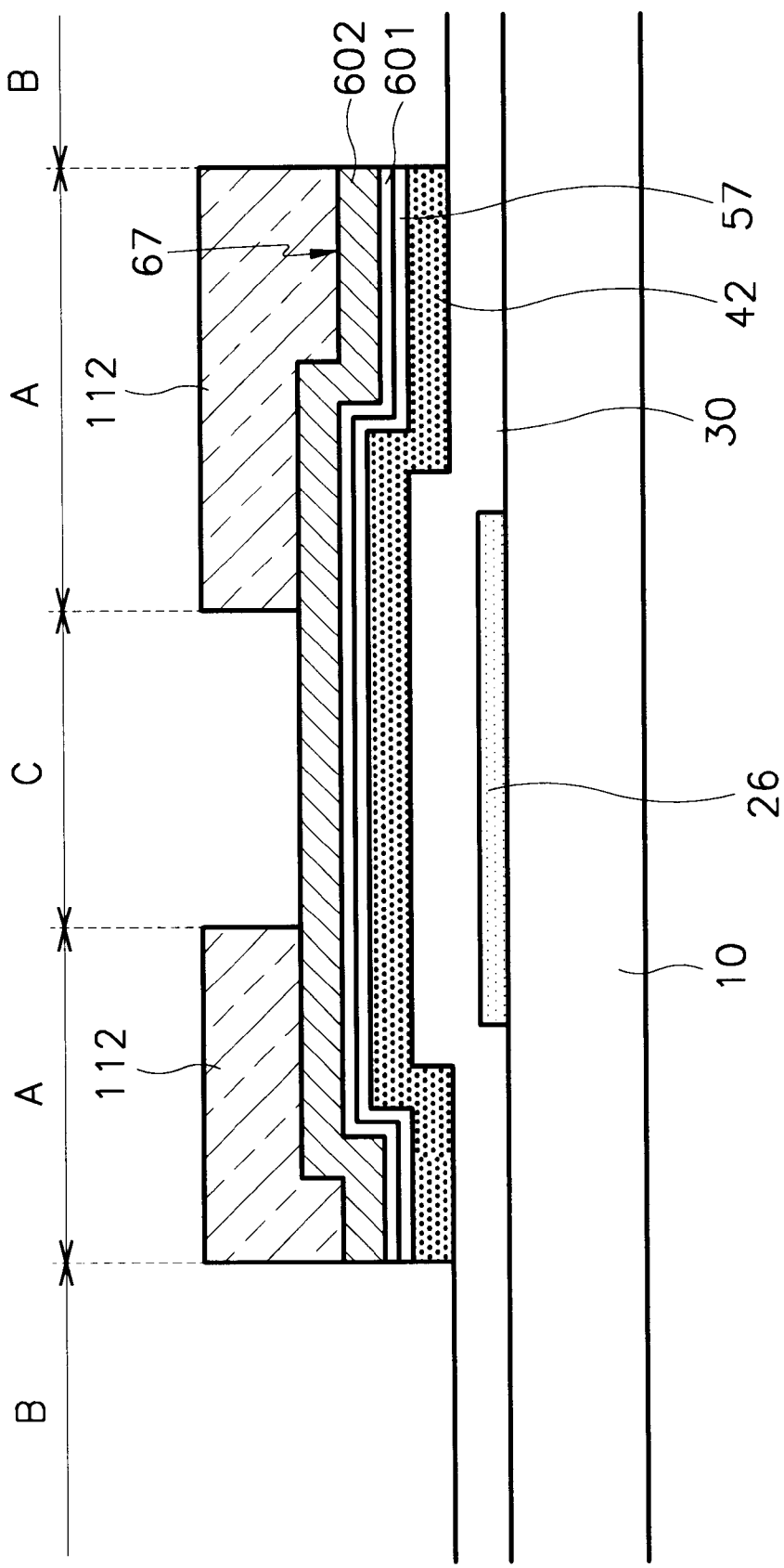

Then, as shown in FIGS. 14A and 14B, the chrome-based under-layer 601 exposed at the B area, and the underlying ohmic contact layer 50 and semiconductor layer 40 are continuously etched through dry etching. At this time, the dry etching may be performed in situ, or not. The dry etching gas may be selected from a mixture of $Cl_2$ and $O_2$, or a mixture of HCl and $O_2$. The etching for the ohmic contact layer 50 and the semiconductor layer 40 should be performed under the condition that the photoresist patterns 112 and 114, the ohmic contact layer 50 and the semiconductor layer 40 are simultaneously etched, but the gate insulating layer 30 is not etched (The semiconductor layer and the ohmic contact layer have almost the same etching ratio. Particularly, it is preferable that the etching ratios of the photoresist patterns 112 and 114 and the semiconductor layer 40 are nearly the same, and the dry etching gas uses a mixture including $SF_6$ or HCl. When the photoresist patterns 112 and 114 and the semiconductor layer 40 have the same etching ratio, the second photoresist pattern 114 should have a thickness identical with or lower than the sum of those of the semiconductor layer 40 and the ohmic contact layer 50. In this way, the under-layer 601 with a thin thickness is etched together with the ohmic contact layer 50 and the semiconductor layer 40 to simplify the processing steps. The under-layer 601 may be formed with other metallic materials provided that it can be patterned together with the ohmic contact layer 50 and the semiconductor layer 40.

Consequently, as shown in FIGS. 14A and 14B, only conductive patterns 67 for the TFTs, and conductive patterns 64 for the storage capacitors are left, and the conductive film 60 at the B area is all removed. At this time, the conductive patterns 67 and 64 have the same shape as the data line assembly except that the source and drain electrode 65 and 66 are not yet separated from each other. Furthermore, the second photoresist pattern 114 at the channel area C is removed and exposes the source/drain conductive pattern 67. The ohmic contact layer 50 and the semiconductor layer 40 at the B area are removed and exposes the underlying gate insulating layer 30. Meanwhile, the first photoresist pattern 112 at the data line assembly area A is also etched. Furthermore, at this step, semiconductor patterns 42 and 48 are completed. Reference numerals 57 and 58 indicate the ohmic contact pattern under the source/drain conductive pattern 67, and the ohmic contact pattern under the storage capacitor conductive pattern 64.

The source/drain conductive pattern 67 at the channel area C may be formed through a separate PR etch back process. Such a PR etch back process may be omitted if the photoresist film can be etched sufficiently. Such a process is performed by removing the photoresist residue remaining at the source/drain conductive pattern 67 through ashing.

Figure 15B:
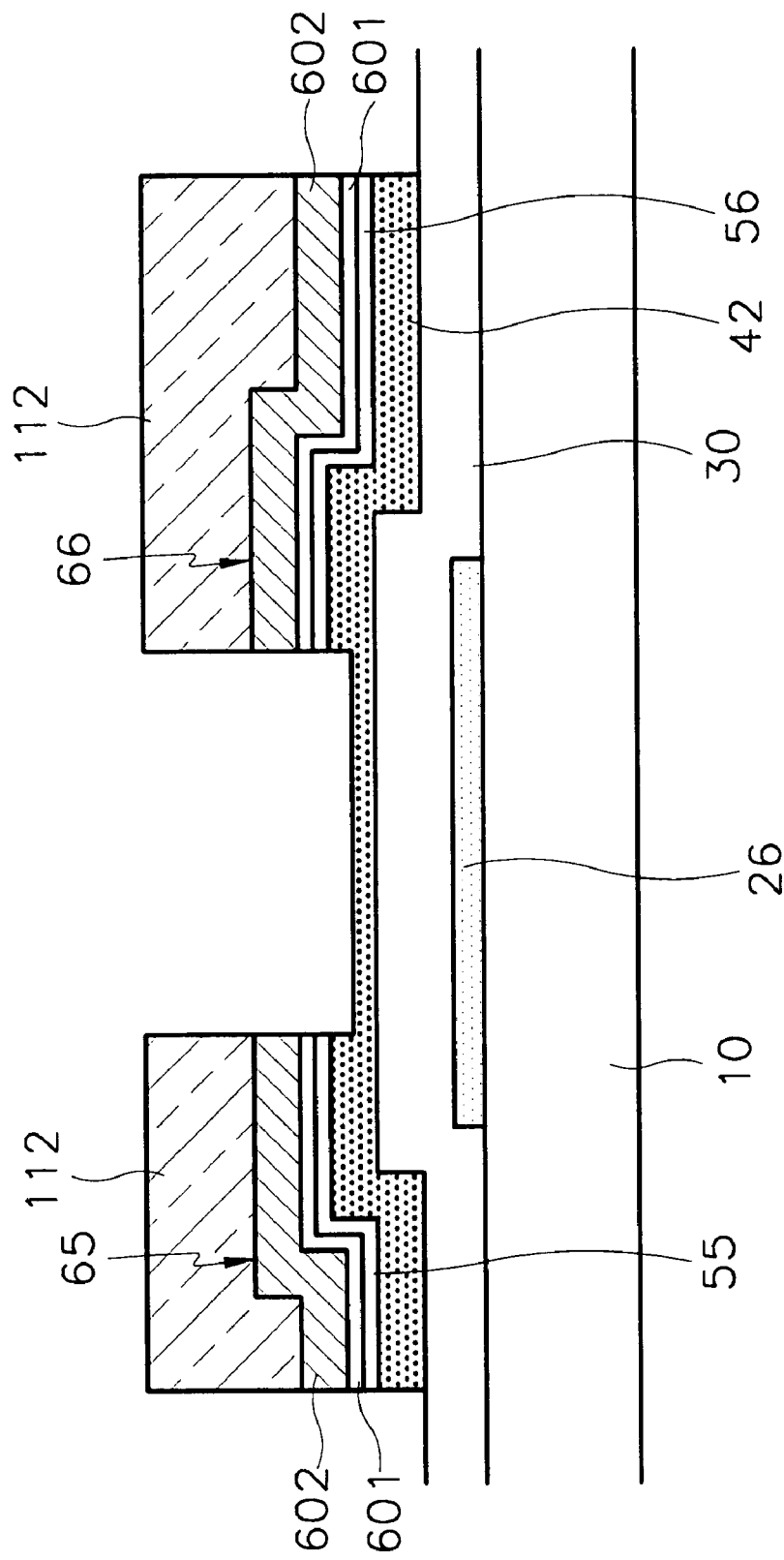

Thereafter, as shown in FIGS. 15A and 15B, the source/drain conductive pattern 67, and the underlying ohmic contact pattern 57 are removed through etching. In this step, dry-etching is performed with respect to all of the source/drain conductive pattern 67 and the underlying ohmic contact pattern 57. Alternatively, the source/drain conductive pattern 67 may be wet-etched and the ohmic contact pattern 57 may be dry-etched. In this preferred embodiment, the aluminum-based over-layer 602 is etched through dry or wet etching, and the chrome-based under-layer 601 and the ohmic contact pattern 57 are continuously etched through dry etching. At this time, the chrome-based under-layer 601 is established to bear a thin thickness, and patterned through dry etching together with the ohmic contact pattern 57, simplifying the processing steps. In case the chrome-based under-layer 601 has a large thickness, wet etching may be applied thereto. At this time, as shown in FIG. 15B, the semiconductor pattern 42 and the first photoresist pattern 112 may be partially removed. In this step, the gate insulating layer 30 should not be etched. Of course, the thickness of the first photoresist pattern 112 should be large enough to prevent it from being completely removed while exposing the underlying data line assembly.

In this way, the source electrode 65 and the drain electrode 66 are separated from each other and complete the data line assembly and the underlying ohmic contact patterns 55, 56 and 58.

Finally, the first photoresist pattern 112 remaining at the data line assembly area A is removed. Alternatively, the first photoresist pattern 112 may be removed before the ohmic contact pattern 57 is removed together with the source/drain conductive pattern 67 at the channel area C.

Figure 16A:
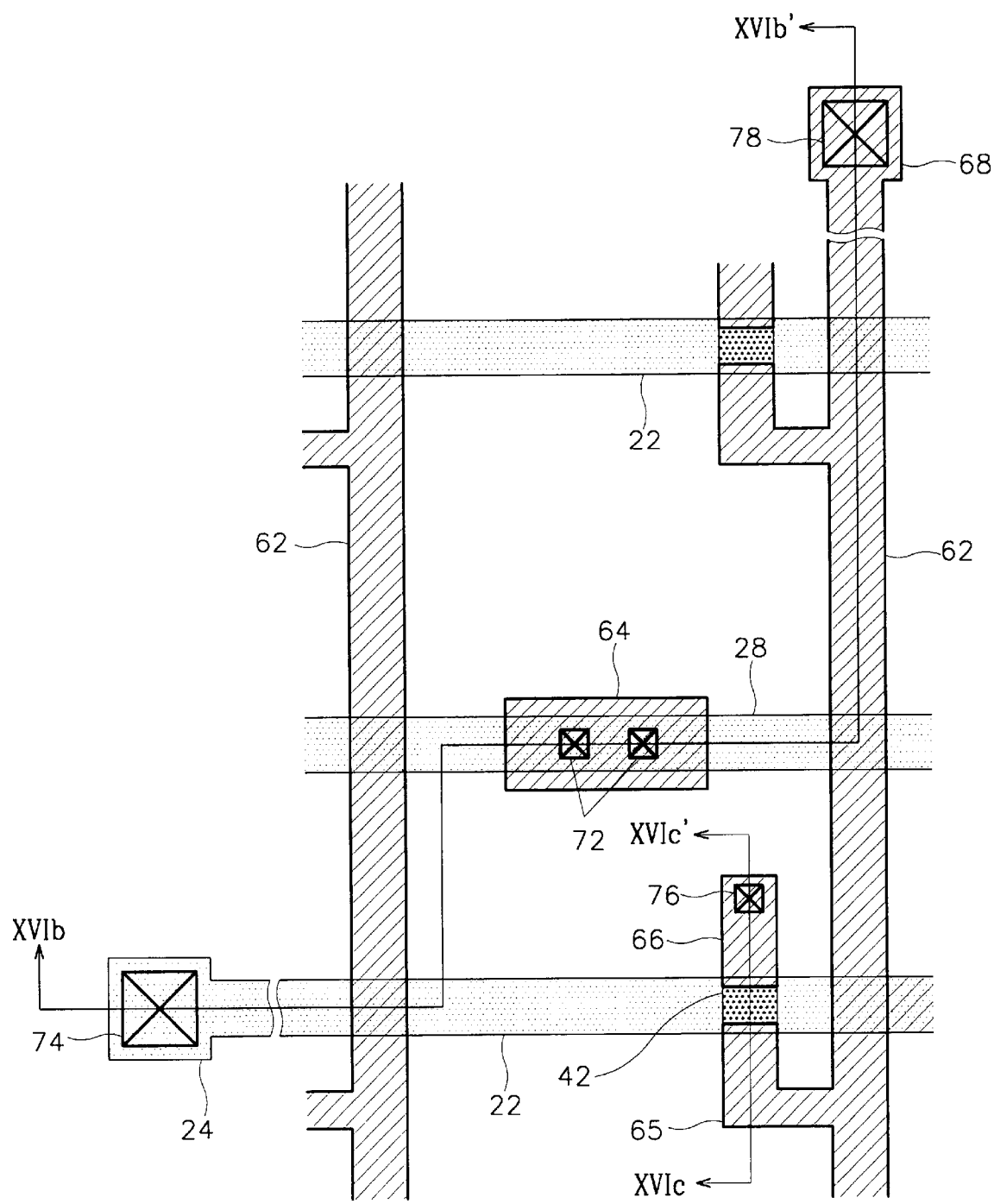
FIG. 16A is a plan view of the TFT array substrate at its fabricating step subsequent to that illustrated in FIGS. 15A and 15B.
Figure 16B:
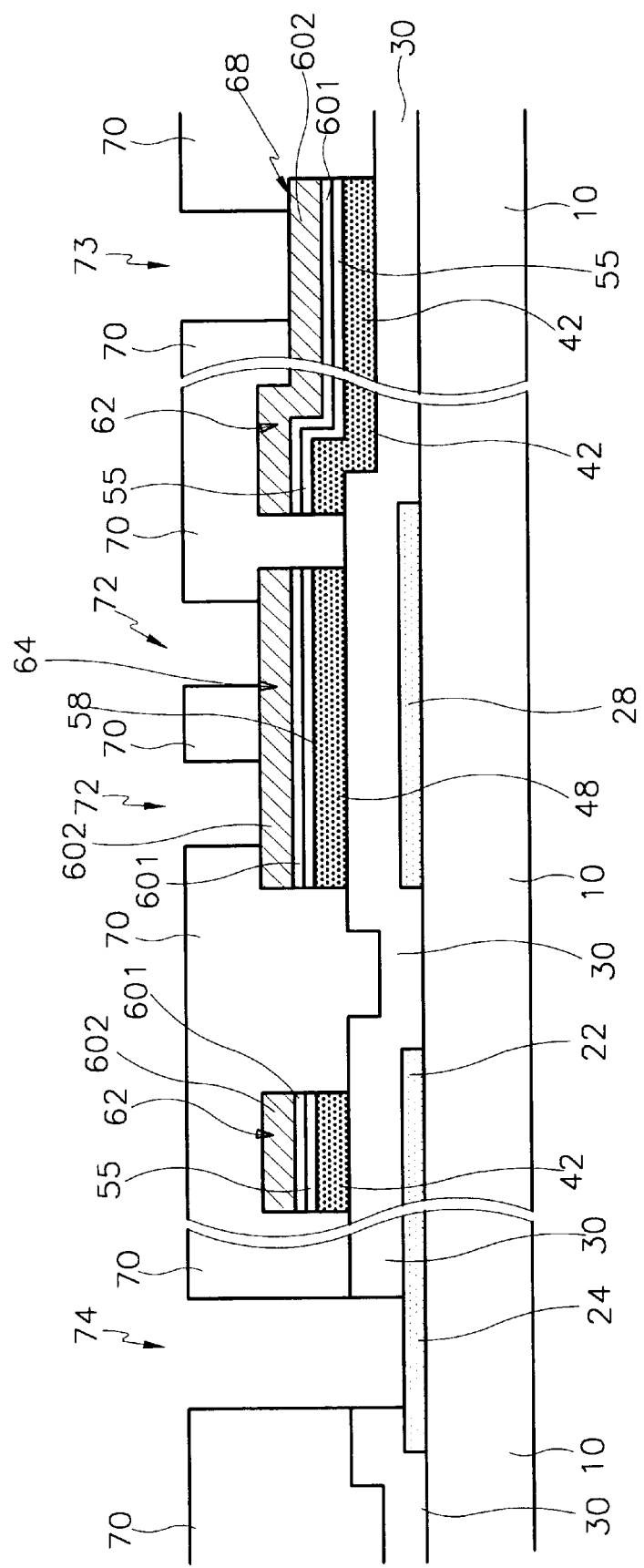
FIGS. 16B and 16C are cross sectional views of the TFT array substrate taken along the XVIb–XVIb' line and the XVIc–XVIc' line of FIG. 16A.
Figure 16C:
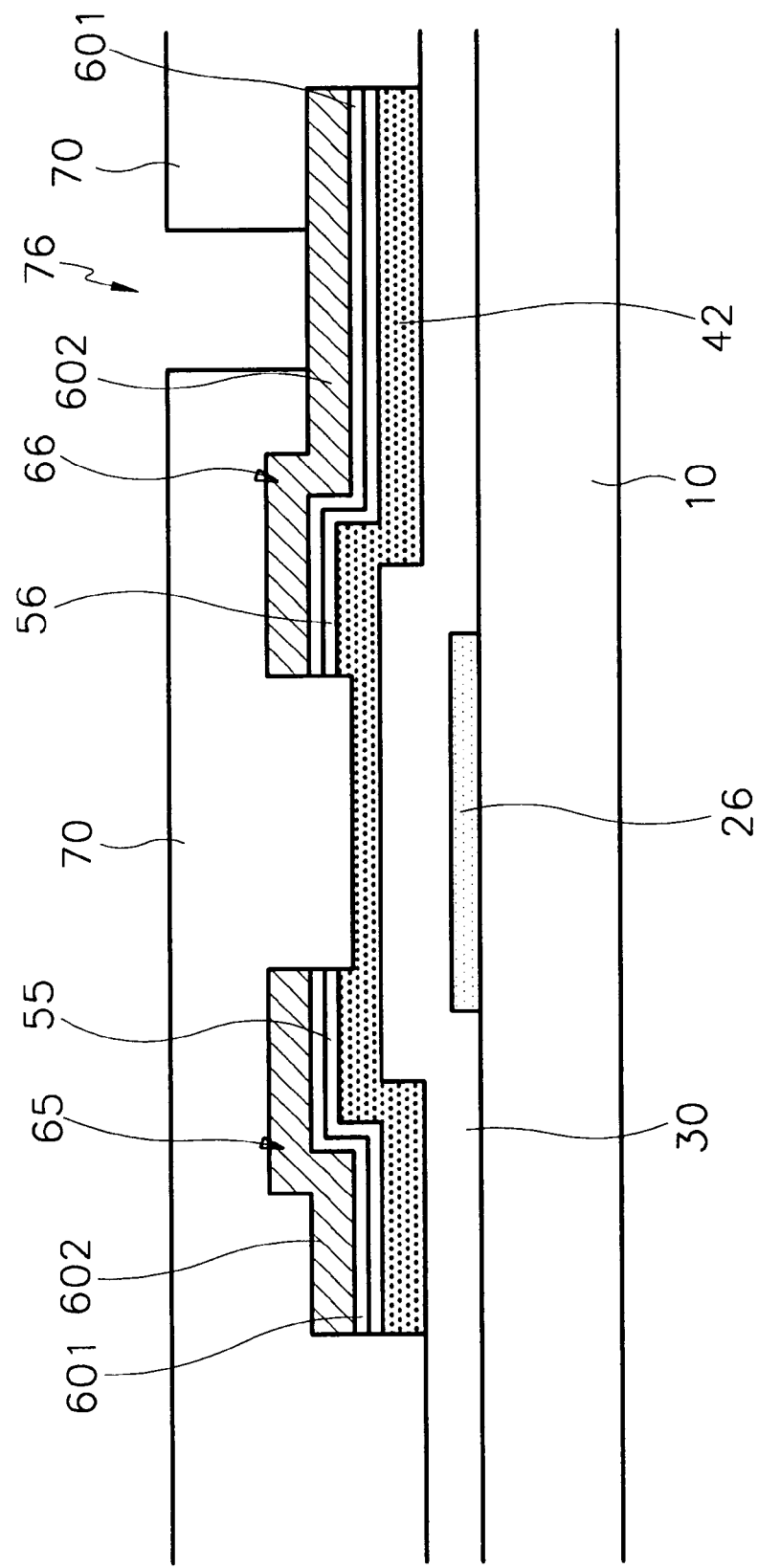

After the data line assembly is formed, as shown in FIGS. 16A to 16C, silicon nitride is deposited through CVD, or organic insulating material is spin-coated to form a protective layer 70 with a thickness of 3000 Å or more. Thereafter, the protective layer 70 is etched together with the gate insulating layer 30 using a third mask to form contact holes 71 to 74 exposing the drain electrodes 66, the gate pads 24, data pads 68, and the storage capacitor conductive patterns 64. In order to minimize contact resistance between the aluminum-based layers 66, 24 and 68 and the IZO-based layers 82, 84 and 88, the residual material is removed from the aluminum-based layers 66, 24 and 68 through annealing. A separate lower-resistant layer containing $Al_xSi_x$ may be formed on the aluminum-based layer 66, 24 and 68, and silicon may be introduced when the over-layers of the aluminum-based gate line assembly and data line assembly are formed. The annealing process may be performed separately after etching the passivation layer 70, or introduced when the gate insulating layer 30 or the protective layer 70 is formed. At this time, it is desirable that annealing step as a thermal treatment process is executed in range of 280–400° C.

Finally, as shown in FIGS. 7 through 9, an IZO-based layer with a thickness of 400–500 Å is deposited onto the substrate 10, and etched using a fourth mask to form pixel electrodes 82 connected to the drain electrodes 66 and the storage capacitor conductive patterns 64, and subsidiary gate and data pads 84 and 88 connected to the gate and data pads 24 and 68.

In this second preferred embodiment, the data line assembly and the underlying ohmic contact patterns 55, 56 and 58 and semiconductor patterns 42 and 48 are formed using only one mask while separating the source and drain electrodes 65 and 66 from each other, thereby simplifying the processing steps. Furthermore, the chrome-based under-layer 601, the ohmic contact layer 50, and the semiconductor layer 40 are continuously etched through dry etching, thereby simplifying the processing steps.

Experimental results where the chrome-based layer was etched using a mixture of $Cl_2$ and $O_2$ or a mixture of HCl and $O_2$ will be now explained with reference to FIGS. 17 and 18.

Figure 17:
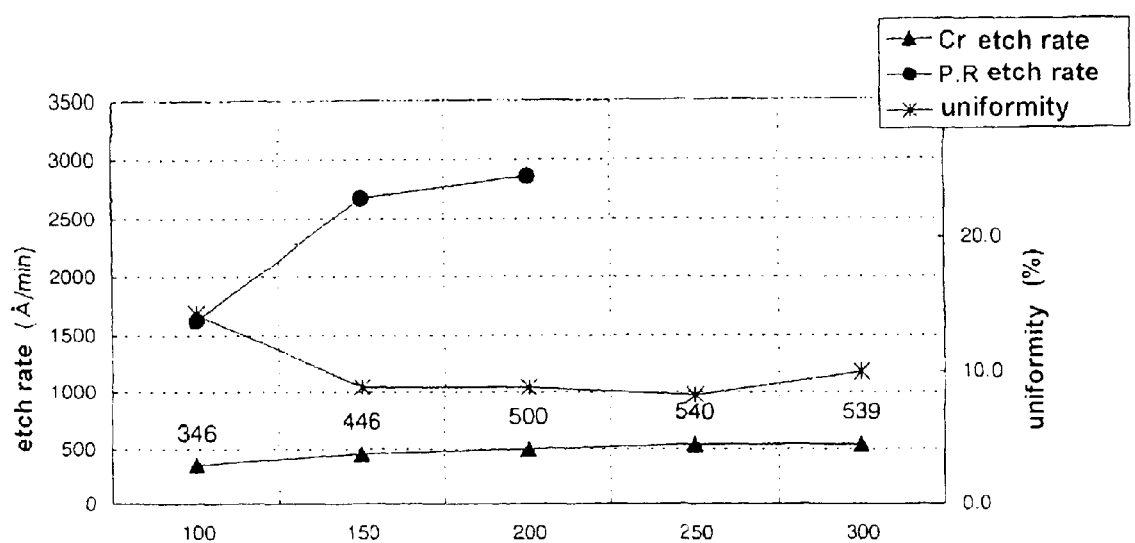
FIG. 17 is a graph illustrating the etching ratio of a chrome-based layer using $Cl_2/O_2$ as the dry-etching gas.
Figure 18:
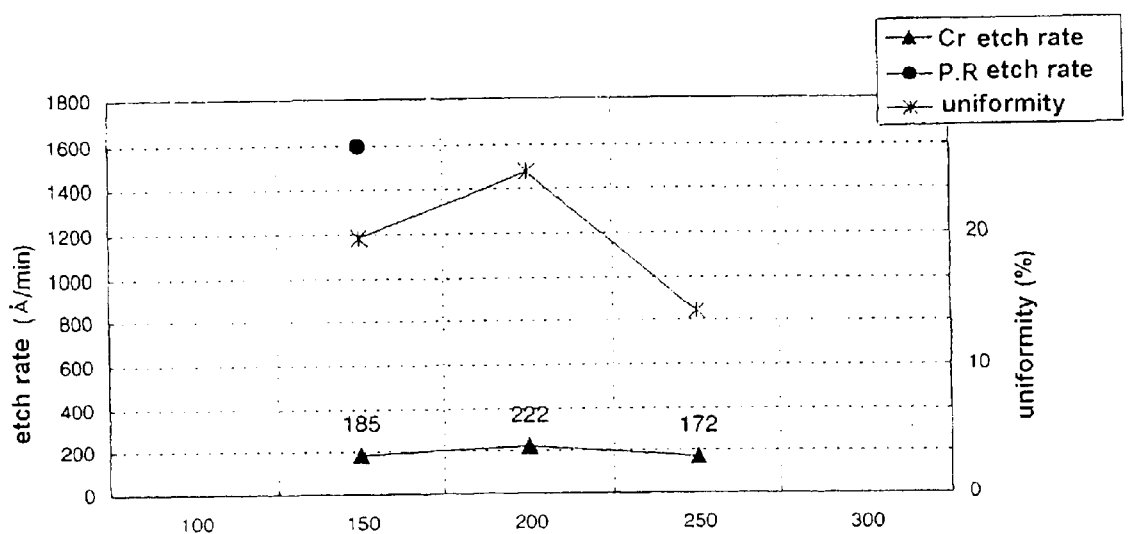
FIG. 18 is a graph illustrating the etching characteristics of a chrome-based layer when a mixture of $Cl_2$ and $O_2$ and a mixture of HCl and $O_2$ is used to dry-etch the chrome-based layer.
Figure 19A:
FIGS. 19A to 19D are photographs of a chrome-based layer taken through scanning electron microscope (SEM).
Figure 19B:
Figure 19C:
Figure 19D:
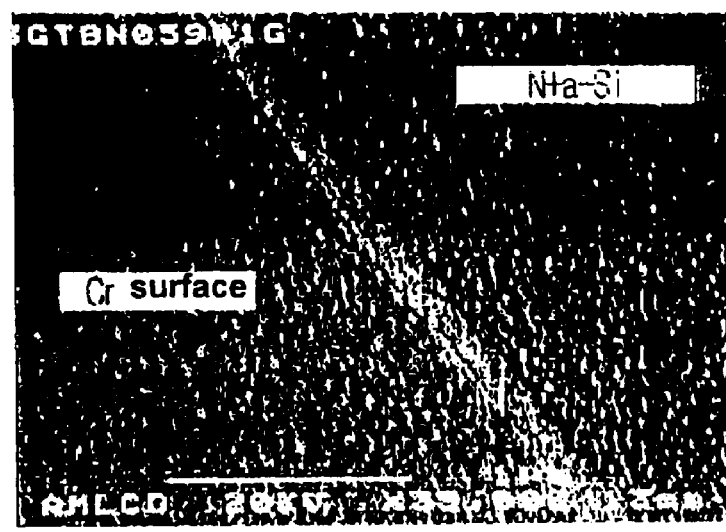

FIGS. 17 and 18 are graphs illustrating the properties of the chrome-based layer etched using a mixture of $Cl_2$ and $O_2$ or a mixture of HCl and $O_2$ as the etching gas in the TFT array substrate fabricating process.

In the experiments, the chrome-based layer 601 was etched using a plasma etching equipment for etching the semiconductor layer 40 and the ohmic contact layer 50. In the dry etching condition, the pressure was established to be 300 mT, the power to be 1800 W, and the inter-electrode distance of the chamber to be 60 mm. FIG. 17 illustrates the case where $Cl_2$ of 400 sccm is used for the dry etching gas, and FIG. 18 illustrates the case where HCl of 400 sccm is used for the dry etching gas.

In the drawings, the left vertical axis indicates the etching ratio, the right vertical axis indicates uniformity in etching, and the horizontal axis indicates variations in $O_2$.

As shown in FIG. 17, when $Cl_2$ was used as the dry etching gas, it turned out that the etching ratio of the chrome-based layer was in the range of 350–540 Å, and the uniformity in etching was measured to be 10%. The amount of etching was measured to be 1600–2800 Å, and the etching selection ratio between the chrome-based layer and the doped amorphous silicon layer to be 8–16:1 although the results are not illustrated at the graphs.

As shown in FIG. 18, in case HCl was used as the dry etching gas, it turned out that the etching ratio of the chrome-based layer was measured to be 200 Å, and the uniformity in etching to be 14–25%. The amount of etching of the photoresist film was measured to be 1600 Å.

FIGS. 19A to 19D are photographs of the chrome-based layer taken by scanning electron microscope where dry etching was performed for 80 seconds in conditions of 300 mT, 1800 W, $Cl_2$ of 400 sccm, and 6 mm.

As shown in the photographs, the surface quality of the chrome-based layer and the doped amorphous silicon layer was measured to be in a good state, and the tapering angle of the chrome-based layer to be 25–30°, which means a good profile.

As described above, the metal-based layer is formed to be thin, and patterned together with the semiconductor layer, thereby simplifying the processing steps. The wiring is formed of aluminum or aluminum alloy to achieve a device of a wide screen as well as high definition.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method for fabricating a thin film transistor array substrate, comprising the steps of:

forming a gate line assembly of an aluminum-based conductive layer onto an insulating substrate, the gate line assembly comprising gate lines, and gate electrodes connected to the gate lines;

depositing a gate insulating layer over the substrate and the gate line assembly;

forming a semiconductor layer on the gate insulating layer;

forming a data line assembly of a double-layered conductive film with a first layer and a second layer overlying the first layer, the data line assembly comprising data lines crossing over the gate lines, source electrodes connected to the data lines, and drain electrodes separated from the source electrodes while interposing the gate electrodes;

forming a protective layer having first contact holes over the drain electrodes; and forming pixel electrodes on the protective layer such that the pixel electrodes are connected to the drain electrodes through the first contact holes, wherein the first layer of the conductive film is patterned through dry etch.

2. The method of claim 1, wherein the pixel electrodes are formed of indium zinc oxide.

3. The method of claim 1, wherein the gate line assembly further comprises gate pads receiving scanning signals from the outside and transmitting the scanning signals to the gate lines, the data line assembly further comprises data pads receiving picture signals from the outside and transmitting the picture signals to the data lines, the protective layer further comprising second and third contact holes exposing the data pads and the gate pads together with the gate insulating layer, and subsidiary gate and data pads being formed at the same plane as the pixel electrodes while being connected to the gate and data pads through the second and third contact holes.

4. The method of claim 1, wherein the data line assembly and the semiconductor layer are formed together through photolithography using photoresist patterns having more than two different thickness.

5. The method of claim 1, wherein the photoresist patterns comprise a first pattern with a predetermined thickness, a second pattern with a thickness smaller than the thickness of the first pattern, and a third pattern with no thickness.

6. The method of claim 5, wherein the photoresist patterns are made using a mask, the mask comprising a first region with a predetermined light transmission, a second region with a light transmission lower than the light transmission of the first region, and a third region with a light transmission higher than the light transmission of the first region.

7. The method of claim 6, wherein the first photoresist pattern is placed over the data line assembly, and the second photoresist pattern is placed between the source and drain electrodes.

8. The method of claim 7, wherein the mask is provided with a semi-transparent film or a slit pattern with a slit size smaller than the decomposition capacity range of light exposure to control the light transmission of the first, second and third regions in a different manner.

9. The method of claim 1, further comprising the step of forming an ohmic contact layer between the semiconductor layer and the data line assembly.

10. The method of claim 9, wherein the data line assembly, the ohmic contact layer and the semiconductor layer are formed using one mask.

11. The method of claim 10, wherein the first layer of the conductive film, the ohmic contact layer and the semiconductor layer are continuously patterned through dry etching.

12. The method of claim 11, wherein the dry etching gas comprises $Cl_2$ or HCl.

13. The method of claim 1, wherein the first layer of the conductive film is thinner than the second layer.

14. The method of claim 1, wherein the first layer of the conductive film is formed with a chrome-based material, and the second layer of the conductive film is formed with an aluminum-based material.

* * * * *